(12) United States Patent
Feseker et al.

(10) Patent No.: US 12,246,387 B2
(45) Date of Patent: Mar. 11, 2025

(54) DEVICE FOR SHIFTING AT LEAST ONE SUB-ASSEMBLY BETWEEN A PROVISIONING ZONE AND WORKING ZONE

(71) Applicant: Siegfried Hofmann GmbH, Lichtenfels (DE)

(72) Inventors: Daniel Feseker, Lichtenfels (DE); Michael Deuerling, Lichtenfels (DE); Michael Förste, Lichtenfels (DE); Kai Fuhrmann, Lichtenfels (DE); Johannes Günther, Lichtenfels (DE); Benedikt Bechmann, Lichtenfels (DE); Heinz Nolden, Bad Salzdetfurth (DE)

(73) Assignee: Siegfried Hofmann GmbH, Lichtenfels (DE)

( * ) Notice: Subject to any disclaimer, the term of this patent is extended or adjusted under 35 U.S.C. 154(b) by 69 days.

(21) Appl. No.: 18/007,168

(22) PCT Filed: Jul. 27, 2021

(86) PCT No.: PCT/EP2021/070989
§ 371 (c)(1),
(2) Date: Jan. 27, 2023

(87) PCT Pub. No.: WO2022/023334
PCT Pub. Date: Feb. 3, 2022

(65) Prior Publication Data
US 2023/0234152 A1    Jul. 27, 2023

(30) Foreign Application Priority Data
Jul. 28, 2020 (DE) .......................... 102020119877.9

(51) Int. Cl.
B23K 37/04    (2006.01)
B23K 1/008    (2006.01)
(Continued)

(52) U.S. Cl.
CPC .............. *B23K 1/008* (2013.01); *B23K 1/012* (2013.01); *B23K 3/04* (2013.01); *B23K 3/08* (2013.01);
(Continued)

(58) Field of Classification Search
CPC .......... B23K 1/008; B23K 1/012; B23K 3/04; B23K 3/08; B23K 1/0016;
(Continued)

(56) References Cited

U.S. PATENT DOCUMENTS

| | | | |
|---|---|---|---|
| 5,922,230 A | * | 7/1999 | Yokota .................... F27B 9/243 228/180.1 |
| 6,860,417 B1 | | 3/2005 | Ramos |

(Continued)

FOREIGN PATENT DOCUMENTS

| | | | | |
|---|---|---|---|---|
| CN | 1516543 A | * | 7/2004 | |
| CN | 1665632 A | * | 9/2005 | ............. B23K 1/012 |

(Continued)

OTHER PUBLICATIONS

International Search Report and Written Opinion dated Oct. 20, 2021, pertaining to Int'l Patent Application No. PCT/EP2021/070989.

*Primary Examiner* — Kiley S Stoner
(74) *Attorney, Agent, or Firm* — Dinsmore & Shohl LLP

(57) ABSTRACT

Device (1) for displacing at least one assembly (2, 2') between a provisioning zone (3) and a working zone (4) of at least one process chamber (5) of a process chamber apparatus (6) for soldering, in particular for reflow soldering, comprising at least one displacement device (7), wherein the at least one assembly (2, 2') carries out, at least in sections, a displacement movement (9), or such a displacement movement (9) can be carried out, such that the at least one assembly (2, 2') is displaced by means of a force (Continued)

(8), in particular pushing force, which is transmitted or generated by the displacement device (7), in particular directly, and acts on the assembly (2, 2').

19 Claims, 10 Drawing Sheets

(51) Int. Cl.
| | |
|---|---|
| *B23K 1/012* | (2006.01) |
| *B23K 3/04* | (2006.01) |
| *B23K 3/08* | (2006.01) |
| *B23K 37/047* | (2006.01) |
| *H01L 21/67* | (2006.01) |
| *H01L 21/677* | (2006.01) |

(52) U.S. Cl.
CPC ...... *B23K 37/047* (2013.01); *H01L 21/67173* (2013.01); *H01L 21/67178* (2013.01); *H01L 21/6776* (2013.01)

(58) Field of Classification Search
CPC .. B23K 37/04–047; B23K 2101/36–42; H01L 21/67173; H01L 21/67178; H01L 21/6776
USPC .......... 228/6.2, 43, 44.7, 49.5, 179.1–180.22
See application file for complete search history.

(56) References Cited

U.S. PATENT DOCUMENTS

| | | | | |
|---|---|---|---|---|
| 7,578,423 | B1* | 8/2009 | Duan | ............... H01L 24/78 |
| | | | | 228/49.5 |
| 2007/0284417 | A1* | 12/2007 | Yamada | ................ B23K 1/008 |
| | | | | 228/101 |
| 2013/0119112 | A1* | 5/2013 | Sukekawa | ............... B23K 3/04 |
| | | | | 228/49.5 |
| 2014/0367451 | A1* | 12/2014 | Yokota | .................... B23K 3/04 |
| | | | | 228/47.1 |
| 2015/0136836 | A1 | 5/2015 | Suter et al. | |
| 2016/0143156 | A1 | 5/2016 | Zhang | |
| 2022/0181177 | A1* | 6/2022 | Becker | .................... H01L 22/12 |
| 2023/0180395 | A1* | 6/2023 | Becker | ................ B23K 1/0016 |
| | | | | 228/180.21 |

FOREIGN PATENT DOCUMENTS

| | | | | | |
|---|---|---|---|---|---|
| CN | 102067742 | A | * | 5/2011 | ........... B23K 1/0016 |
| CN | 103079739 | A | * | 5/2013 | ........... B23K 1/0016 |
| CN | 106270910 | A | * | 1/2017 | |
| CN | 107112247 | A | * | 8/2017 | ............ B23K 1/002 |
| CN | 108907386 | A | * | 11/2018 | |
| CN | 106081487 | B | * | 4/2019 | ............ B23K 1/008 |
| CN | 111168335 | A | * | 5/2020 | |
| DE | 3631209 | A1 | | 3/1988 | |
| DE | 3715940 | A1 | * | 12/1988 | |
| DE | 4225378 | A1 | | 9/1993 | |
| DE | 19619485 | A1 | | 12/1997 | |
| DE | 19731753 | A1 | | 1/1999 | |
| DE | 10031071 | A1 | | 1/2002 | |
| DE | 10162327 | A1 | | 5/2003 | |
| DE | 102016222114 | A1 | | 5/2018 | |
| DE | 112018006652 | T5 | * | 11/2020 | ........... B23K 1/0016 |
| JP | H08330721 | A | * | 12/1996 | |
| JP | 2011171714 | A | * | 9/2011 | ............... B23K 1/00 |
| JP | 2017079507 | A | | 4/2017 | |
| KR | 101324483 | B1 | | 11/2013 | |
| KR | 20140071390 | A | * | 6/2014 | |
| KR | 20140074317 | A | * | 6/2014 | |
| KR | 20140105859 | A | * | 9/2014 | |
| KR | 1020160043839 | A | | 4/2016 | |
| KR | 101796669 | B1 | | 11/2017 | |
| WO | 199707924 | A1 | | 3/1997 | |
| WO | WO-2012086533 | A1 | * | 6/2012 | ............... B23K 1/00 |
| WO | 2013005875 | A1 | | 1/2013 | |
| WO | 2020249474 | A1 | | 12/2020 | |

* cited by examiner

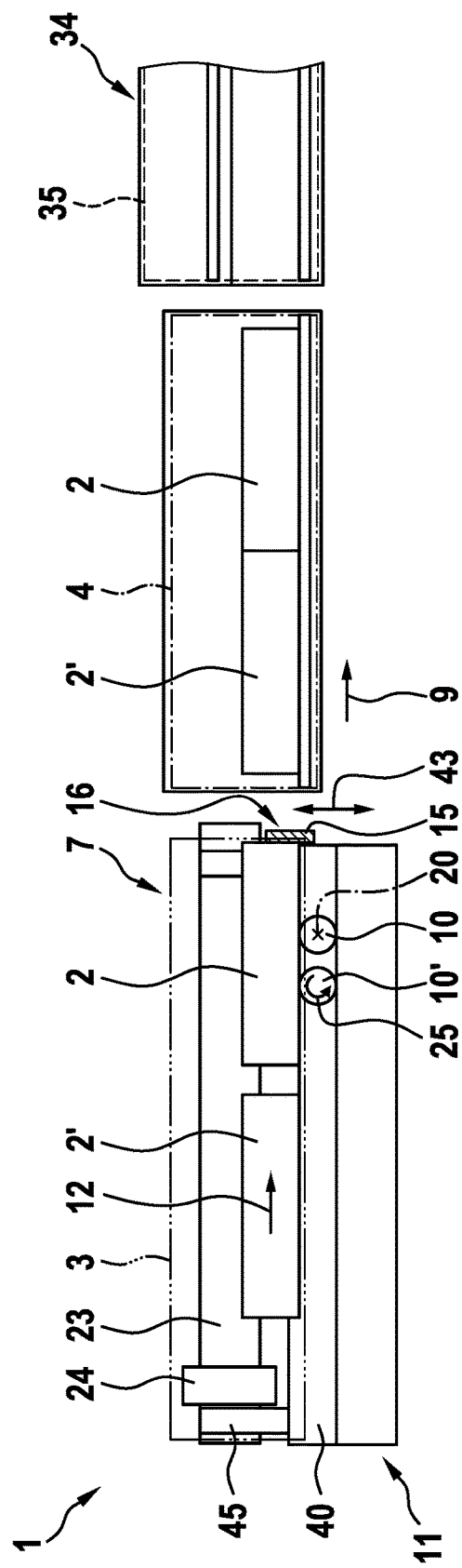
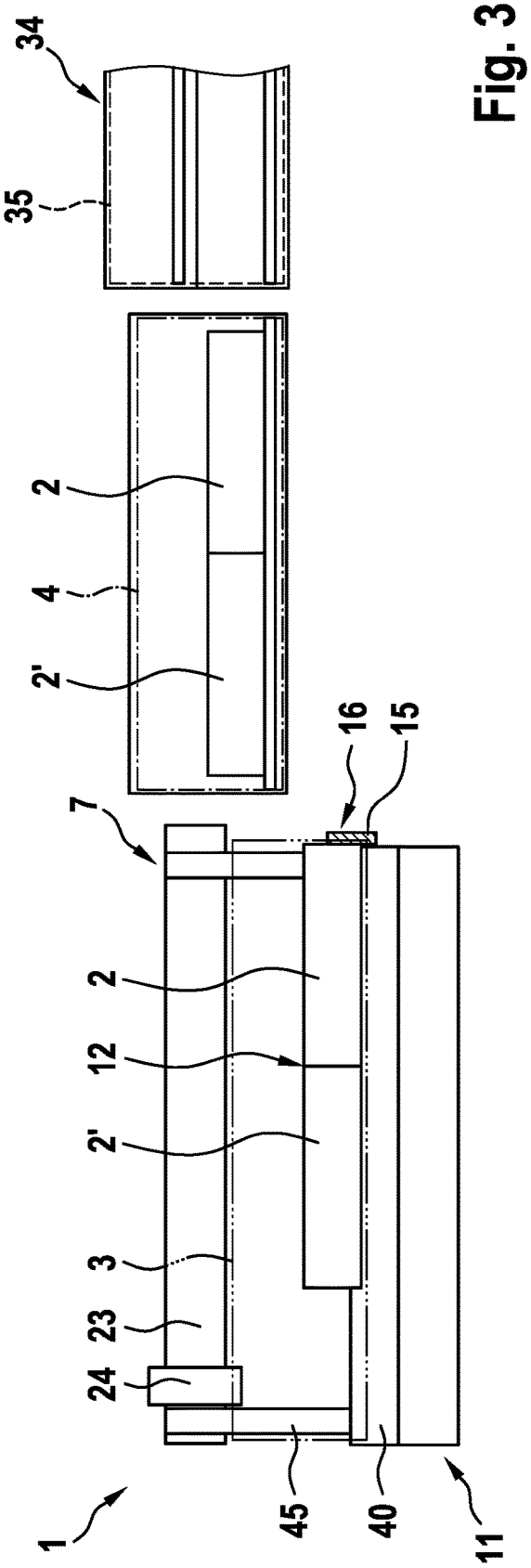

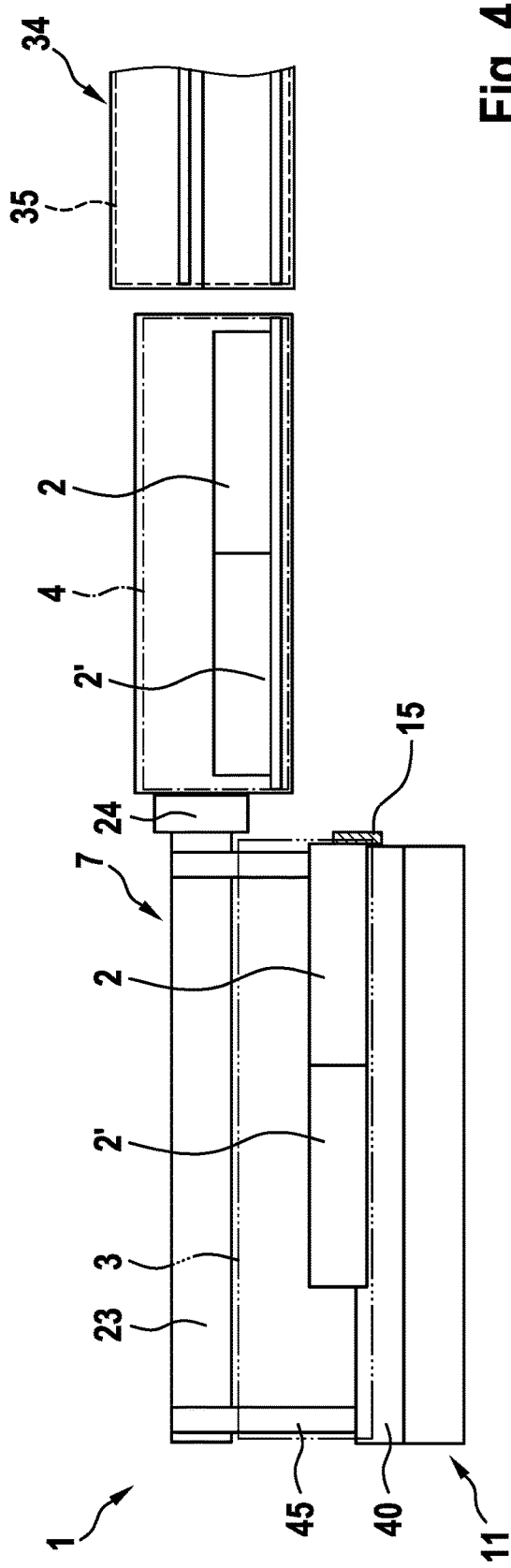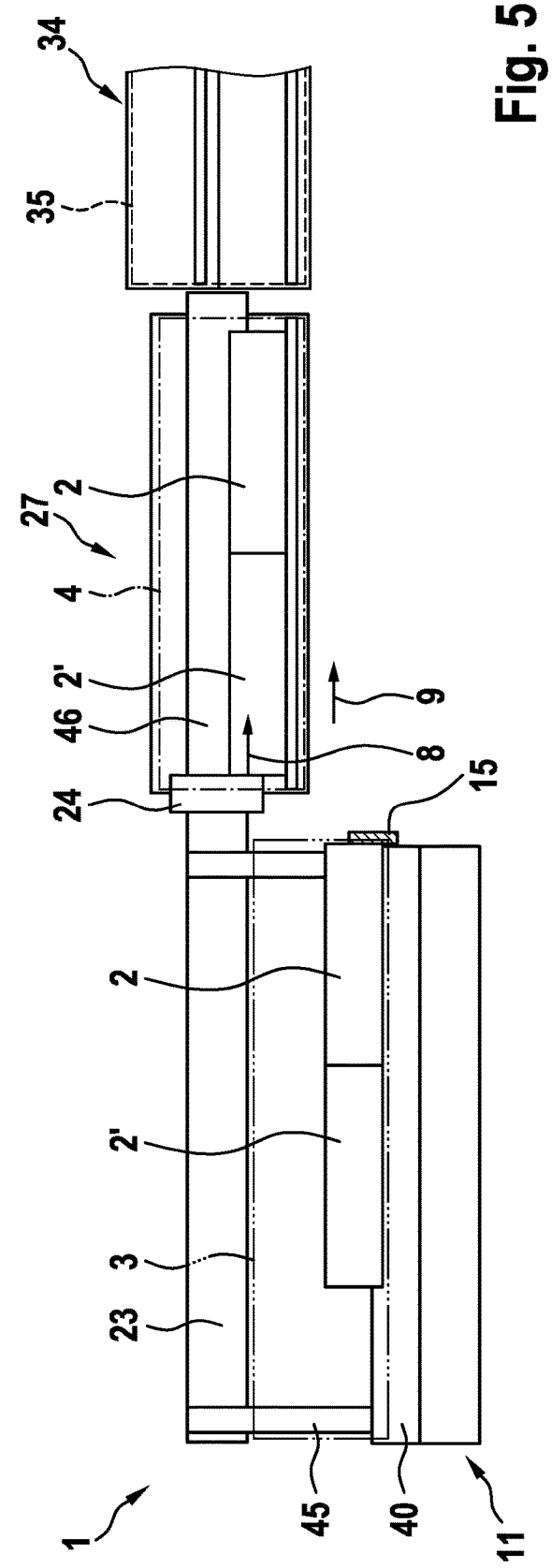

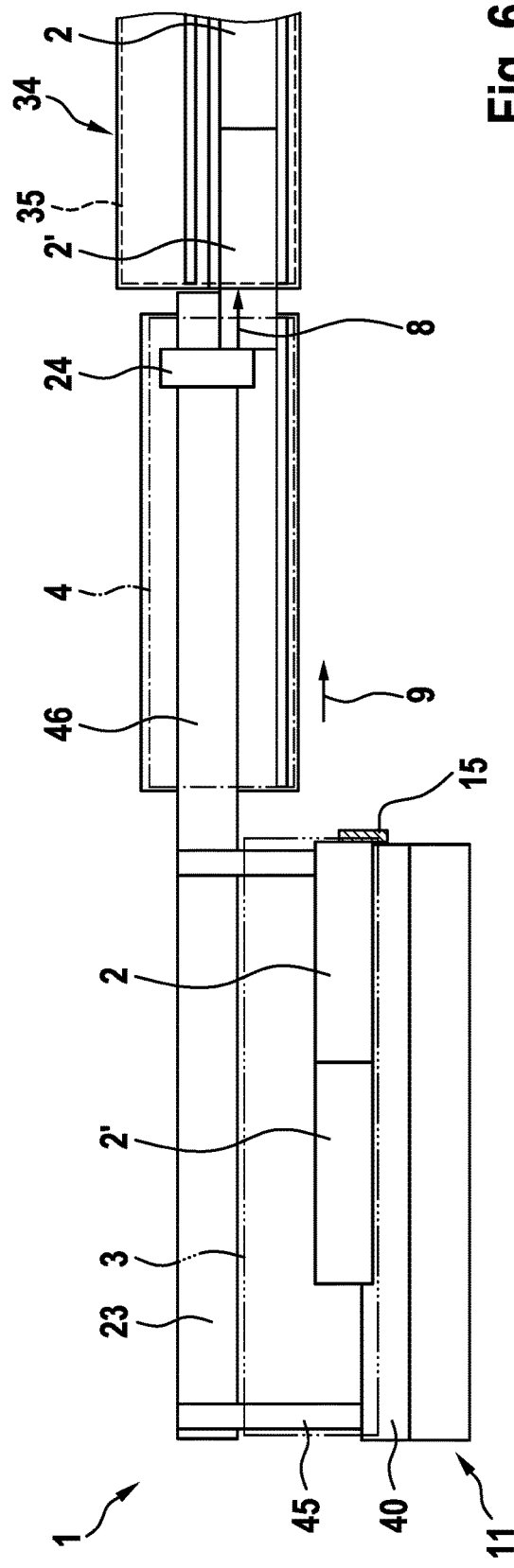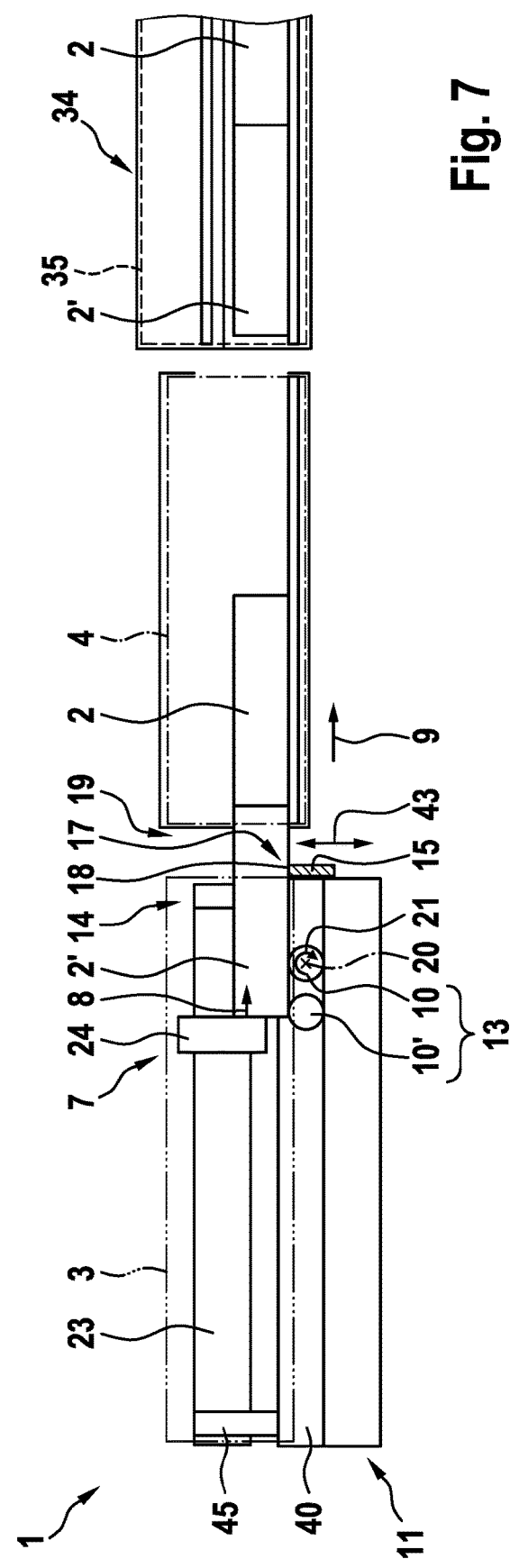

DEVICE FOR SHIFTING AT LEAST ONE SUB-ASSEMBLY BETWEEN A PROVISIONING ZONE AND WORKING ZONE

CROSS-REFERENCE TO RELATED APPLICATIONS

This application is a national stage application, filed under 35 U.S.C. § 371, of Internal Patent Application No. PCT/EP2021/070989, filed Jul. 27, 2021, which claims the benefit of DE Application No. 10 2020 119 877.9, filed Jul. 28, 2020, which are incorporated by reference herein in their entireties.

FIELD

The present disclosure generally relates to devices and methods for displacing at least one assembly and, more specifically, devices and methods for displacing at least one assembly between a provisioning zone and a working zone.

SUMMARY

The present disclosure relates to a device for displacing at least one assembly between a provisioning zone and a working zone of at least one process chamber of a process chamber apparatus for soldering, in particular for reflow soldering.

The present disclosure relates to a device and to a method for displacing at least one assembly between a provisioning zone and a working zone of at least one process chamber of a process chamber apparatus for soldering, in particular for reflow soldering. In this case, the assembly typically comprises a printed circuit board provided with conductor tracks and further electronic components which are attached to or placed on the printed circuit board. This assembly is brought into the process chamber of the process chamber apparatus, where it is exposed to thermal energy and/or a defined gas atmosphere, e.g. an inert gas atmosphere. In this course, a permanent at least electrical connection is formed between the components and the board or between the electronic components and the conductor tracks of the board.

The object of the present disclosure is that of providing a device which, in particular with regard to a simple and fast as well as cost-effective measure, enables the handling of at least one assembly to be introduced into and/or removed from a process chamber. In particular, a feed and/or a removal of an assembly subjected to thermal energy in a process chamber can be configured or implemented more advantageously.

The object is achieved by means of a device for displacing at least one assembly between a provisioning zone and a working zone of at least one process chamber of a process chamber apparatus for soldering.

The present disclosure relates to a device for displacing at least one assembly between a provisioning zone, in particular a provisioning zone associated with a supporting device, and a working zone of at least one process chamber of a process chamber apparatus for soldering, in particular for reflow soldering of an assembly. A reflow soldering process can be carried out in the process chamber, for example, for which purpose at least one assembly, consisting of at least two components, is introduced and a connection of individual components of the assembly is produced by application of thermal energy, wherein a liquid phase can be produced by melting of a solder or by diffusion at the interfaces. As a rule, the components are not melted to their depth. In this case, a material bond between the components is typically formed by the melting and solidification of the solder. The device used is configured to achieve a defined temperature control of the assembly or the components and the solder, so that the solder is melted.

The device comprises at least one displacement device, wherein the at least one assembly carries out a displacement movement at least in sections by means of a force, in particular a pushing force, transmitted or generated by the displacement device, in particular directly, and acting on the assembly, and/or such a displacement movement can be carried out that the at least one assembly is displaced. In other words, the device is arranged such that a displacement device is at least temporarily in direct or indirect contact with the at least one assembly and displaces or relocates it. The displacement may be effected by applying a corresponding force to the at least one assembly so that it is displaced from a first location to a further location. Specifically, the assembly is displaced between a provisioning zone located outside the process chamber and a working zone located in at least one process chamber due to the application of force by the displacement device. In this case, the working zone can form a volume inside the process chamber or the interior of the process chamber, within which the at least one assembly remains or is arranged during the thermal energy application and thus during the soldering process (e.g. during reflow soldering).

The displacement device may, for example, enable the at least one assembly located on the supporting device and/or in the process chamber to be displaced. Alternatively or additionally, the displacement device can apply a pushing force to a first assembly, wherein the first assembly at least temporarily contacts a further assembly and the pushing force acts on the first assembly acting on the further assembly via the contact of the first assembly with the further assembly, and thus finally, at least in sections, both assemblies undergo a targeted displacement as a result of the action of the displacement device, which in particular moves linearly and/or parallel to a main extension plane of an assembly.

The application of force, in particular a pushing force application or pulling force application, to the at least one assembly by the displacement device can form at least one active movement component in an overall movement path of the at least one assembly between a provisioning zone and a working zone. In other words, a transfer movement of the at least one assembly between a provisioning zone on the supporting device side and a working zone on the process chamber apparatus side is initiated at least partially (with respect to the total distance) by the displacement device.

The device may include a supporting device that comprises at least one bearing means, wherein the at least one assembly can be arranged or is arranged on the at least one bearing means, in particular directly, at least in sections, such as predominantly, during the displacement movement and is mounted on the supporting device by means of the bearing means so as to be movable at least in the direction of the displacement movement. For example, the bearing means can have a sliding surface which enables a displacement of an assembly resting on the bearing means with a low sliding resistance. Alternatively, the bearing means may be formed, at least in sections, as a planar region having a point-shaped and/or line-shaped contact surface. Alternatively or additionally, the bearing means may be formed at least in part as a bearing means arranged or formed to be movable, in particular rotatable, on a supporting device. For example, the bearing means may include a ball bearing and/or roller bearing. Regardless of the functional principle of the bearing means, the latter can act on an assembly arranged on the supporting device or on an assembly supported by the supporting device in such a way that the at least one assembly has a low or reduced sliding resistance and/or tensile resistance at least parallel to the displacement movement or in the direction of the displacement movement. For example, the bearing means can be configured as a rolling bearing, the inner ring of which is fastened to the supporting device in a rotationally fixed manner and the outer ring of which forms with its outer circumferential surface the contact area for contact with the at least one assembly.

The displacement movement is defined as a movement of the at least one assembly from a supporting device-side provisioning zone to at least one process chamber apparatus-side working zone, and/or vice versa. Also, the displacement movement may comprise a movement of the at least one assembly from a process chamber-side working zone to a collection zone of a collecting device and/or vice versa.

In a further advantageous embodiment, it can be provided that the device is configured, in a first section or in a first partial section of the displacement movement, to carry out a displacement of the at least one assembly at least by a movement of a supporting means, in particular a bearing means, of the supporting device, which supports the at least one assembly at least in sections, and, in a further section or a further partial section of the displacement movement, to carry out a displacement of the at least one assembly at least by the action of the force acting on the at least one assembly by the displacement device. In other words, at least one assembly, in particular a group of assemblies, can be displaced at a first (path) section of the displacement movement by a concomitant movement of this/these assembly(s) with the supporting means carrying this/these assembly(s), e.g. a bearing means which can be moved linearly at least in sections. In a further (path) section of the displacement movement, the assembly(s) is/are set in motion by the application of force (e.g. pulling or pushing force) by the displacement device.

In embodiments, in particular at an end region of the supporting device, at least one restraining means can be arranged or is arranged, which can be moved or displaced between a blocking position and a release position, wherein in the blocking position a movement of at least one assembly carried by the supporting device in the direction of the displacement movement is inhibited or blocked and, in the release position, a movement of at least one assembly carried by the supporting device in the direction of the displacement movement is released. In other words, the at least one assembly can be restrained or inhibited from further displacement along or according to the displacement movement by direct or indirect contact with the at least one restraining means located in the blocking position.

It is possible for the at least one restraining means to counteract, at least in sections, a moving force acting on the assembly in the blocked position. For example, it may be provided that the assembly performs a displacement movement or is moved in the direction of displacement movement at least partially by means of the movement of a supporting means or bearing means carrying the assembly. The contact of the assembly with the restraining means generates a counterforce to the displacement movement, which results in the assembly being held or retained stationary relative to the supporting device and/or relative to the restraining means, and the supporting means, in particular the bearing means, perform a relative movement to the assembly such that the supporting means, in particular the bearing means, are moved relative to the at least one assembly. For example, the bearing means "pass" below the assembly supported by these bearing means. It is roughly comparable to an object conveyed on a conveyor belt, on which a restraining force directed in the opposite direction to the conveying movement of the conveyor belt is established by a contact, in particular direct contact, of the object with the at least one temporarily stationary restraining means.

Retaining or holding in place at least one assembly can be advantageous in order to arrange assemblies located in the supporting device in a more compact manner. For example, an assembly at the front, as seen in the direction of displacement, can be prevented from being transported further by, in particular, direct contact with the restraining means. The assemblies that are typically initially spaced apart behind the front assembly in the displacement direction or in the displacement movement can reduce their distance from the front assembly as a result of being held back by the restraining means, since they can be conveyed further. This can occur until the assembly adjacent to the front assembly contacts the front assembly and the restraining action acts indirectly on the adjacent assembly via the front assembly. In other words, the at least one restraining means can be used to achieve a more compact arrangement of the assemblies in or on the supporting device, in particular in interaction with a conveyor belt-like transport of the assemblies in the supporting device. Such a compact arrangement of the assemblies can be advantageous in order to bring as many assemblies as possible into the working zone. The front assembly can remain in a static waiting position by means of the restraining means until further assemblies have joined the front assembly.

The restraining means may include a supporting region for at least temporarily supporting at least one assembly moved during at least one section of the displacement movement. In this case, the supporting region can be configured in such a way that it has low friction with respect to an assembly supported thereon. Alternatively or additionally, the supporting region may have a similar or identical frictional effect to an assembly supported thereon and moved in the direction of displacement as the bearing means on the supporting device side and/or as a supporting means on the process chamber side. In embodiments, the restraining means may be arranged or formed such that, at least in the release position, the restraining means reduces or shortens a (distance of) interruption to be passed by the at least one assembly of a contact area of the assembly with the supporting means and the process chamber. The contact area may have at least two contact sub-areas, a first contact sub-area being formed by the area of the supporting device (e.g. supporting means/bearing means) contacted by the assembly, and the second contact sub-area being formed by the area of the process chamber (e.g. supporting means) contacted by the assembly.

In order to enable temporary closure of the at least one process chamber by a closure means, a minimum distance between the supporting device and the process chamber is generally necessary for the arrangement of the closure means. This minimum distance can be reduced, for example, by a movable support element that at least temporarily carries an assembly and can be temporarily arranged or retracted in the gap area. In embodiments, the function of the movable support element can be integrated into a restraining means.

The supporting region on the restraining means side or on the support element side can be used to temporarily supplement or extend the contact area by a further contact part area (e.g. when the restraining means is in the release position), so that the contactless and/or guideless path of the assembly between the supporting device and the process chamber is reduced. This provides the advantage that the minimum assembly length of the at least one assembly to be soldered that can be processed in the device for soldering can be reduced, since sufficient guidance and/or movement is ensured even in the gap area with smaller length dimensions of the assembly.

The device can be arranged, for example, to move the at least one assembly in at least one section of the displacement movement by means of a superimposed or coinciding action of a force (e.g. pushing force) acting on the at least one assembly by the displacement device and a movement of the supporting means, in particular at least one bearing means, of a supporting device supporting the at least one assembly. In other words, it may be provided that superimposed or interacting causes for conveying the assembly act on at least one assembly arranged on the supporting device. This makes it possible to reduce the amount of force(s) acting on the assembly by means of the force(s) applied to the assembly by the displacement device, in particular directly by contact, since the effective movement of the at least one assembly results from the action of the displacement device and the movement of the supporting device. Also, any frictional effects and/or acceleration gradients at the contact areas between the supporting device and the at least one assembly are reduced.

In some embodiments, the device comprises at least one bearing means rotatably mounted about an axis of rotation, in particular oriented perpendicularly to the displacement movement. In embodiments, at least a component of the displacement movement of the at least one assembly arranged on a bearing means can be carried out or be carried out under, in particular simultaneous, rotary movement of the at least one rotatably mounted bearing means about the axis of rotation due to the action of the displacement device on the at least one assembly. During this rotational movement of the bearing means, the assembly can rest on the bearing means, in particular directly. Consequently, a force causing the bearing means to rotate is transmitted from the displacement device via the assembly to the bearing means. Alternatively or additionally, the bearing means can carry out a passive movement, i.e. carry out a movement initiated at least in sections or completely, in particular exclusively, by the displacement device and the assembly. In embodiments, the bearing means can be formed as a group of several roller bearings which are rotatably mounted on the supporting device at least in the direction of the displacement movement. In this case, the, for example roller-like, bearing means can be rotatably mounted on the supporting device at least in part, in particular all of the bearing means. In this case, the bearing means can, for example, carry out a rotational movement on several rotational axes oriented parallel to one another and, in particular, oriented perpendicular to the displacement movement.

The at least two bearing means or at least two bearing elements of a bearing means can, for example, be connected via a connecting member, e.g. a conveyor belt or a chain, and can be configured or arranged such that they can be moved, in particular motor-driven, at least in sections in the direction of the displacement movement. The connecting member can, for example, be movably mounted on the supporting device, so that a corresponding movement of the bearing means arranged on the connecting member can be carried out or can be carried out by a specific movement, in particular by a specific motor drive, of the connecting member.

In embodiments, at least two bearing means can carry out an at least sectionally linear transport movement in the direction of the displacement movement, in which an assembly arranged on these bearing means carries out at least one component of a, in particular linear, displacement movement. The connecting member is movably mounted relative to the supporting device by means of a bearing arrangement. The bearing arrangement may, for example, allow a circular or annular movement of the connecting member and the bearing means attached to the connecting member following a closed circle or a closed ring. In other words, the connecting member may perform an endless movement in the manner of, for example, a conveyor belt, and thus an assembly resting on the connecting member via the supporting means, in particular the bearing means, may perform an at least sectionally rectilinear movement. In embodiments, the bearing means are guided or moved in a circuit, wherein a portion, such as a predominant portion, of the displacement movement of an assembly in the region of the supporting device is carried out or initiated at a rectilinear movement section of the bearing means within the movement circuit or circle.

The at least one displacement device can, for example, comprise at least one displacement element movably mounted on a holding body on the displacement device side for at least temporary contact with at least one assembly, the displacement element being movable at least in sections parallel and/or perpendicular to the displacement movement or parallel and/or perpendicular to the supporting device. A movement carried out parallel and/or perpendicular to the displacement movement can in this case comprise, for example, a movement in the direction of the displacement movement or laterally to the displacement movement or perpendicularly upwards or downwards to the displacement movement.

In some embodiments, the displacement element is mounted on a holding body so as to be movable exclusively parallel and/or perpendicular to the displacement movement, the holding body forming the, in particular exclusive, connection of the displacement element to a base body of the supporting device and/or a base body of the displacement device. Thus, a low-cost and/or a precise movement ensuring structure of the device can be achieved. In embodiments, the base body on the displacement device side is the connection interface of the displacement device with the supporting device, wherein the base body can be connected or is connected to the base body on the supporting device side.

The displacement element can form the component of the displacement device which, in particular exclusively, comes into direct contact with the assembly, whereby the direct contact on the assembly applies a pushing force and/or pulling force to it.

For example, the displacement device is movably arranged on the supporting device in such a way that the displacement device can pass over or bridge with its movement at least one assembly arranged on the supporting device, such as at least two assemblies arranged on the supporting device, particularly such as at least three assemblies arranged on the supporting device. Thus, the displacement device, in particular the displacement element can be movable or moved relative to at least one assembly placed on the supporting device in such a way that the displacement device can be moved in the direction of the displacement movement without movement of the assembly or independently of a movement of the assemblies at any end regions of the assemblies. For this purpose, the displacement device can be arranged in a first position at the height of the at least one assembly and, starting from this position, can be moved into a higher or lower position by a movement oriented, in particular exclusively, perpendicularly to the main extension plane of the at least one assembly arranged on the supporting device. In this position raised or lowered from the main extension plane of the at least one assembly, the displacement device can drive over or under the assembly.

After the displacement device has bridged or moved under the assembly in a direction, in particular essentially parallel to the intended displacement movement, of the assembly, the displacement device can be lowered or raised again into the plane lying in the main extension plane of the assembly. In embodiments, this movement can take place within the main extension plane (as viewed from above) of the supporting device.

The holding body, in particular configured as a holding frame, can for example be movably attached or fastened to a base body of the displacement device and/or to the supporting device. For example, the holding body is attached to the base body and the base body is attached to the supporting device, so that, for example, the holding body can be attached exclusively via the base body to the supporting device or to the components of the supporting device that support the at least one assembly. In embodiments, the holding body is movable, in particular exclusively, perpendicularly and/or parallel to a main extension plane of the holding body and/or to a main extension plane of the base body and/or to a main extension plane of the supporting device. The holding body can, for example, be configured as a holding frame, wherein the at least one displacement element can be moved in its position in the manner of a cross slide.

The holding body can, for example, be or be moved, such as motor-driven, between a first covering position in which it is at least predominantly, in particular completely, in coverage with the base body and/or the supporting device and a second pull-out position laterally offset relative to the base body and/or the supporting device. In the pull-out position of the holding body, it is possible for the displacement element movably mounted on the holding body to extend at least temporarily beyond the cover surface of the base body (in plan view) into areas lying next to the base body. The covering position in this case comprises, for example, a covering area of at least 70%, such as at least 85%, such as at least 95%, such as at least 99%, of the total area of the holding body with the base body and/or with the supporting device, as viewed in each case from the top view.

The base body can be a separate, in particular frame-like, component or group of components which is mounted on the supporting device. Alternatively, the base body can be formed at least in sections, in particular completely, as a component of the supporting device.

The supporting device can, for example, comprise wall bodies running parallel to the displacement movement and, in particular, oriented parallel to one another, a receiving track for receiving at least one assembly, in particular for receiving a first group of assemblies, being formed between two wall bodies. In other words, the region lying between two adjacent wall bodies can form a receiving track. In embodiments, the distance between the wall bodies corresponds at least approximately to the length dimension of the at least one assembly present in the transverse direction to the displacement movement. The wall bodies support, e.g. via bearing means and/or supporting means, in particular directly, the at least one assembly within the receiving track. The wall bodies form a component of the supporting device, so that the bearing means can be arranged or formed on or in the wall bodies.

In embodiments, the supporting device may have at least one pick-up track for supporting at least one assembly, the at least one pick-up track width being variable, in particular variable by a motor. A receiving track means here that there is a rectilinear receiving channel in which at least one assembly, such as at least two assemblies, can be received. By adjusting the width of the receiving track, e.g. by parallel displacement of at least one of at least two wall bodies, the receiving track can be adapted to the width or to a length dimension of the at least one assembly extending transversely to the displacement movement.

The supporting device can, for example, be or be moved at right angles to the displacement movement, in particular simultaneously parallel to a main extension plane of the supporting device, of the at least one assembly for carrying out an orientation movement, in order to enable a pick-up and/or delivery of an assembly from an introduction zone to a predefined pick-up track. In embodiments, by means of the orientation movement, a first pick-up track of the supporting device for picking up at least one assembly and at least one second pick-up track of the supporting device for picking up at least one further assembly can be moved relative to a, in particular single-track, introduction zone for insertion or introduction for hand-over of assemblies to the supporting device into an orientation and/or position corresponding to the introduction zone. This makes it possible, for example, despite a stationary and, for example, single-track introduction zone, to assign a first receiving track of the supporting device to the introduction zone in a first relative position of the supporting device and introduction zone, and to assign a second receiving track of the supporting device to the introduction zone in a second relative position of the supporting device and introduction zone, or to move the supporting device into a corresponding transfer position of the introduction zone in a second relative position of the supporting device and introduction zone, into a corresponding transfer position in such a way that an assembly can be transferred or introduced from the introduction zone into or onto a specific or desired receiving track of the supporting device. In other words, a corresponding orientation and/or position means that, in a first state, a first track of the supporting device can be brought into orientation with the, in particular single-track, introduction zone(s) or into a transfer position, and, in a further state, a further track of the supporting device, different from the first track, can be brought into alignment with the introduction zone(s) or into a transfer position.

A process chamber apparatus can, for example, comprise at least two process chambers arranged one above the other, wherein the supporting device can be displaced in height or moved in height in such a way that at least one, in particular all, assembly(s) supported by the supporting device can be displaced or moved optionally into a first or a further process chamber of the process chamber apparatus. In other words, a supporting device carries at least one assembly, wherein this at least one assembly is movable or displaceable into a first process chamber in a first transfer position of the supporting device and is movable or displaceable into a further process chamber in a second transfer position of the supporting device. For this purpose, the supporting device is moved at least in its height position relative to the process chambers and brought into a transfer position associated with the respective process chamber.

In embodiments, a process chamber apparatus may have at least one process chamber, the at least one process chamber comprising a first and a further transfer opening for passing at least one assembly through between a process chamber-side working zone and a carrier-side provisioning zone and/or a collecting device-side collection zone, the transfer openings being arranged or formed on two opposite side surfaces of the, in particular cuboid, process chamber. For example, the process chamber may have a rectangular, in particular square, base surface shape as viewed from above, wherein a first transfer opening is arranged or formed on a first side surface and a further transfer opening is arranged or formed on a side surface opposite the first side surface.

A device can, for example, comprise a process chamber apparatus with at least one process chamber as well as a collecting device, wherein the collecting device comprises a collection carrier which can be moved horizontally and/or vertically in order to receive at least one assembly moved out of the process chamber, such as the collecting device has several groups of receiving tracks, in particular arranged or formed one above the other and/or next to one another. The collecting device can serve, for example, as a buffer for assemblies moved out of the process chambers. In particular, targeted thermal cooling of the assemblies can take place in the collecting device. Alternatively or additionally, the collecting device can be used to enable a targeted output of the at least one assembly from the device, in particular from the process chamber, to a removal device connected to the device or to the process chamber in the material flow or in the processing path. For example, the sequence of receiving assemblies moved out of a process chamber and received in the collecting device and the sequence of discharging assemblies discharged from the collecting device and received by the removal device may be different or identical. That is, a FIFO principle (first-in-first-out principle) can be applied at least temporarily by means of the collecting device and/or a mode deviating from a FIFO principle can be "run" at least temporarily. For example, it is possible to have the sequence of the assemblies delivered from the collecting device to a removal device (a) differ from the sequence of the assemblies introduced into the collecting device and/or (b) differ from the sequence of the assemblies introduced into the process chamber from the supporting device and/or (c) differ from the sequence of the assemblies introduced from an introduction zone to the supporting device.

The collecting device can, for example, comprise two opposite feed-through openings, a first feed-through opening facing the process chamber serving to receive the assembly into the collecting device and a second feed-through opening facing away from the process chamber serving to discharge the assembly to the removal device. For example, the collecting device can be configured in the manner of a horizontally and vertically movable shelf-like system, wherein feed-through openings can be provided at both main extension boundary planes of the collecting device for receiving or discharging the assemblies received in the collecting device.

In embodiments, the device comprises a displacement device arranged to, (a) to move an assembly arranged in a supporting device-side provisioning zone into a process chamber-side working zone and/or (b) to move an assembly arranged in a process chamber-side working zone into a supporting device-side provisioning zone and/or (c) to move an assembly arranged in a process chamber-side working zone into a collecting device-side collection zone and/or (d) to move an assembly arranged or formed in a collecting device-side collection zone into a process chamber-side working zone. In particular, this movement can be performed by contact and application of a force, such as a pushing force and/or pulling force, to at least one assembly by a displacement device-side displacement element. The movement of the assembly during the transfer between the provisioning zone and the working zone and/or between the working zone and the collection zone can be effected, such as at least predominantly, such as exclusively, by action of the displacement device on the supporting device side. Thus, it is possible that the at least one process chamber apparatus comprising the working zone, in particular the process chamber thereof, and/or the collecting device comprising the collection zone do not comprise any elements driving or actively initiating a predominant displacement or no displacement of the assembly. In other words, the at least one process chamber and/or the at least one collecting device can be configured without an actively driving displacement function for the at least one assembly and the displacement function can be performed exclusively by means (e.g. displacement device and/or moving support and/or bearing means) of the supporting device.

The displacement device can, for example, be configured in such a way that a movement of an assembly (a) at and/or across a gap between the supporting device-side provisioning zone and the process chamber-side working zone and/or (b) at and/or across a gap between the process chamber-side working zone and the collecting device-side collection zone and/or (c) within the working zone and/or (d) within the provisioning zone is effected at least in sections, in particular completely, such as exclusively, by the action of the displacement device. This makes it possible to achieve a simple structure, with the displacement initiation function being provided only at the supporting device. It also makes it possible to simply configure the process chamber apparatus exposed to thermal fluctuations due to process chamber operation, or at least to expose none or fewer elements used for assembly displacement to these thermal fluctuations.

In embodiments, the displacement device at least partially relative to the supporting device and/or (b) the displacement element relative to the holding body and/or (c) the holding body relative to the base body and/or to the supporting device and/or (d) the at least one bearing means within the supporting device and/or (e) the bearing means can be moved or moved about an axis of rotation on the side of the bearing means and/or (f) a collecting device, in particular exclusively, by means of a motor. It may be provided, for example, to provide a separate motor for each of the above-mentioned relative movements of the components of the device. Alternatively, the movement of at least two components of the device can be distributed starting from a common motor via a transmission apparatus.

In embodiments, a collecting device is configured to receive at least one assembly moved out of the process chamber. The collecting device can, for example, comprise a temperature control device, in particular a cooling device. Alternatively, a temperature control device, in particular a cooling device, can be associated with the collecting device. By means of the temperature control device, in particular cooling device, at least one assembly accommodated in the collecting device can be temperature controlled, in particular cooled. For example, the cooling device can introduce a cooled gas flow into the interior of the collecting device, so that the assemblies arranged in this interior of the collecting device are cooled thereby. Alternatively or additionally, the cooling device can carry out a cooling of elements in contact with the assemblies, so that a corresponding cooling of the assemblies takes place due to the contact of these elements with the assembly.

In embodiments, the pull-out body may be mounted or configured so that it can be moved at least in sections relative to a supporting device, in particular exclusively linearly, such that the pull-out body is configured so that it can be telescoped.

In addition to the device for displacing at least one assembly, the present disclosure also relates to a method for displacing at least one assembly between a provisioning zone and a working zone of at least one process chamber of a process chamber apparatus for soldering, in particular for reflow soldering, wherein the assembly carries out a displacement movement and is displaced at least in sections by means of a force, in particular a pushing force, which is transmitted or generated by a displacement device, in particular directly, and acts on the assembly. In some embodiment of the method, a displacement movement of the at least one assembly is carried out by the direct application of this assembly by means of a pushing force applied on the displacement device side. In other words, the assembly can be pushed or pulled by the displacement device, wherein the supporting device may include bearing means which reduce a pushing resistance of the at least one assembly relative to the supporting device during the application of a pushing or pulling force on the side of the displacement device.

All advantages, details, embodiments and/or features of the device according to the present disclosure are transferable or applicable to the process according to the present disclosure.

BRIEF DESCRIPTION OF THE DRAWINGS

The present disclosure is explained in more detail by means of exemplary embodiments in the drawings. The figures show in:

FIGS. 2 to 7 schematically depicts illustrations of different times during the displacement of an assembly by the displacement device according to an embodiment;

DETAILED DESCRIPTION

Figure 1:
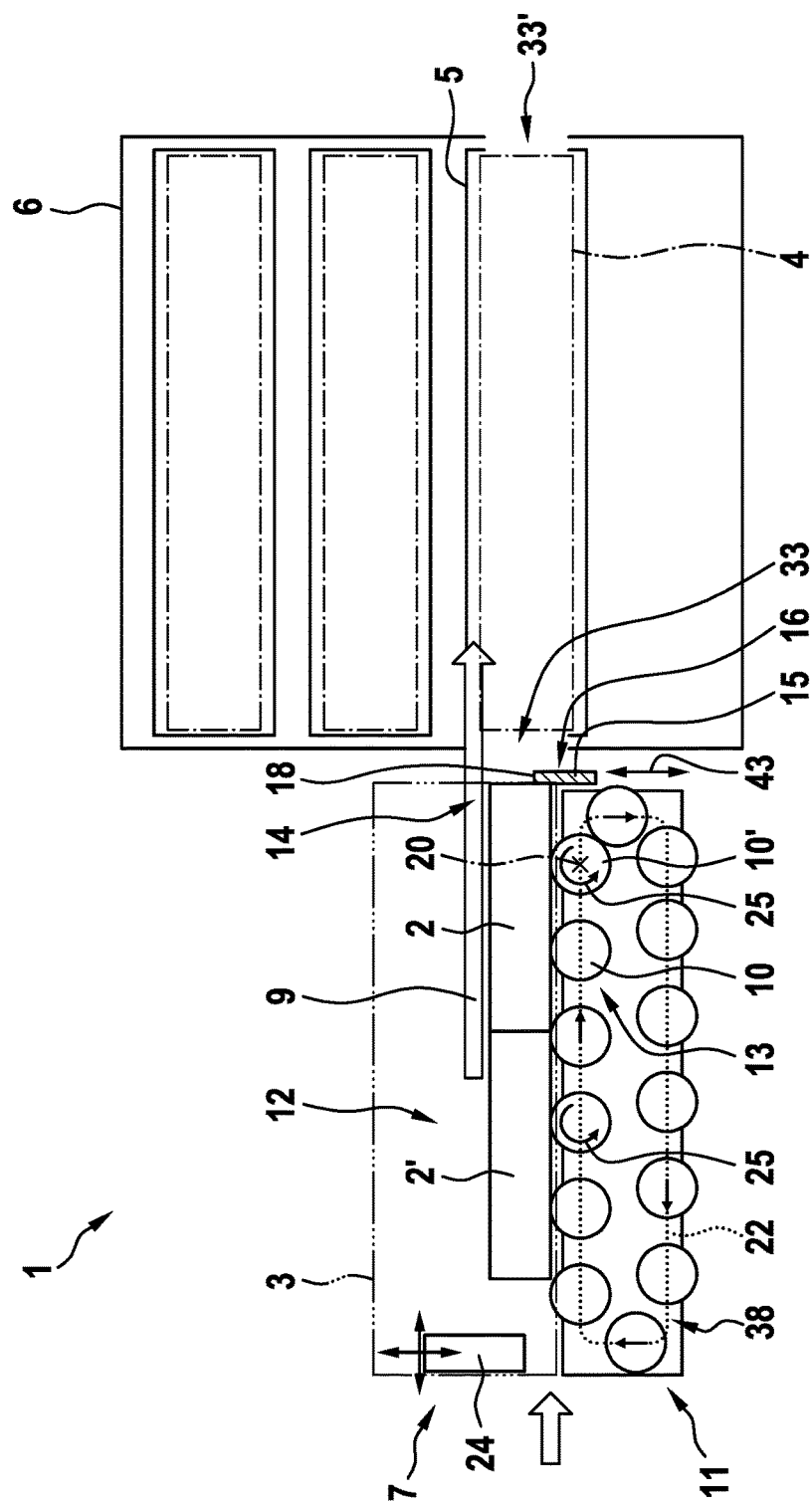
FIG. 1 schematically depicts a device according to an embodiment.

The figures show a device 1 for displacing at least one assembly 2, 2' between a provisioning zone 3 and a working zone 4 of at least one process chamber 5 of a process chamber apparatus 6 for soldering, in particular for reflow soldering, the assemblies 2, 2'. Here, a soldering process is carried out on the assembly 2, 2' consisting of at least two assembly component elements (not shown) by the action of thermal energy in the interior of the process chamber 5, which leads to a materially bonded connection of the assembly elements. At the provisioning zone 3, the at least one assembly 2, 2' is held and/or supported by a supporting device 11. In particular, the at least one assembly 2, 2' can rest on the supporting device 11 due to gravity.

The device 1 comprises at least one displacement device 7, which can be moved or changed in its position and/or orientation. The at least one assembly 2, 2' is set into a displacement movement 9 at least in sections by means of a force 8 (cf. arrow), in particular a pushing force, which is transmitted and/or generated by the displacement device 7, in particular directly, and which acts on the assembly 2, 2', cf. FIG. 7. In other words, the at least one assembly 2, 2' carries out a displacement movement 9 at least in sections as a result of the application of force by the displacement device 7, so that the assembly 2, 2' can be displaced, for example, from a provisioning zone 3 on the supporting device side to a working zone 4 on the process chamber apparatus side and/or vice versa. Through the contact of the displacement device 7, at least one assembly 2, 2' can be pushed on to carry out the displacement movement 9. With the pushing of the assemblies 2, 2' by the displacement device 7, a displacement of the at least one assembly 2, 2' takes place, for example, the displacement device 7 can be in direct contact with a first assembly 2' and the first assembly 2' can be in direct contact with a further assembly 2, so that both assemblies 2, 2' are moved simultaneously, at least in sections, for carrying out the displacement movement 9. In other words, the further assembly 2 can be moved, in particular pushed, at least in sections via the action of the displacement device 9 on the first assembly 2' and the action of the first assembly 2' on the further assembly 2.

The supporting device 11 can comprise at least one bearing means 10, 10', cf. FIG. 1. In embodiments, the supporting device 11 comprises at least two bearing means 10, 10'. The at least one assembly 2, 2' can be arranged or is arranged on the at least one bearing means 10, 10', in particular directly, at least in sections, such as predominantly, during the displacement movement 9. For example, the assemblies 2, 2' rest on the bearing means 10 during a predominant section during the displacement movement 9. By means of the at least one bearing means 10, 10', the at least one assembly 2, 2' can be mounted on the supporting device 11 so as to be movable at least in the direction of the displacement movement 9. In other words, a bearing means 10, 10' can be configured in such a way that an assembly 2, 2' arranged on or resting on the bearing means 10, 10' has a reduced resistance (sliding resistance) when pressurized in the direction of the displacement movement 9. For example, the bearing means 10, 10' can be configured at least in sections, in particular completely, as a sliding surface on which the at least one assembly 2, 2' can be moved during the displacement movement 9 of the assembly 2, 2'. In some embodiments, the at least one bearing means 10, 10' is formed as a rolling bearing (e.g. roller and/or ball bearing) or as a bearing means 10, 10' formed as a rolling element.

In embodiments, the device 1 is configured, in a first section 12 (cf. FIGS. 2, 3) of the displacement movement 9, to effect a displacement of the at least one assembly 2, 2' at least by a movement of a supporting means 13, in particular of a bearing means 10, of the supporting device 11, which supports the at least one assembly 2, 2' at least in sections, and, in a further section 14 (cf. FIG. 7) of the displacement movement 9, a displacement of the at least one assembly 2, 2' is carried out at least by the action of the force 8, in particular a pushing force, acting on the at least one assembly 2, 2' by means of the displacement device 7. In the embodiment according to FIG. 1, a first section 12 of the displacement movement 9 is shown, in which the displacement device 7 is placed at a distance from the assemblies 2, 2'. Consequently, in this state no force 8, in particular no pushing force, is applied by the displacement device 7 to the at least one assembly 2. The displacement movement 9 takes place in this section 12, in particular exclusively, due to a movement of the supporting means 13 of the supporting device 11, which are here exemplarily formed as bearing means 10, 10'. The bearing means 10, 10' are, for example, connected to a connecting member 22 and are mounted on the supporting device 11 in such a way that the bearing means 10, 10' with the connecting member 22 perform a common relative movement to the supporting device 11 or to a base body 40 of the supporting device 11. Due to the fact that the at least one assembly 2, 2' rests on the at least one bearing means 10, 10', the at least one assembly 2, 2' is selectively displaced by the relative movement of the supporting means 13 with respect to the base body 40 of the supporting device 11, or a section 12 of the displacement movement 9 of the assembly 2, 2' is thereby carried out.

Figure 12:
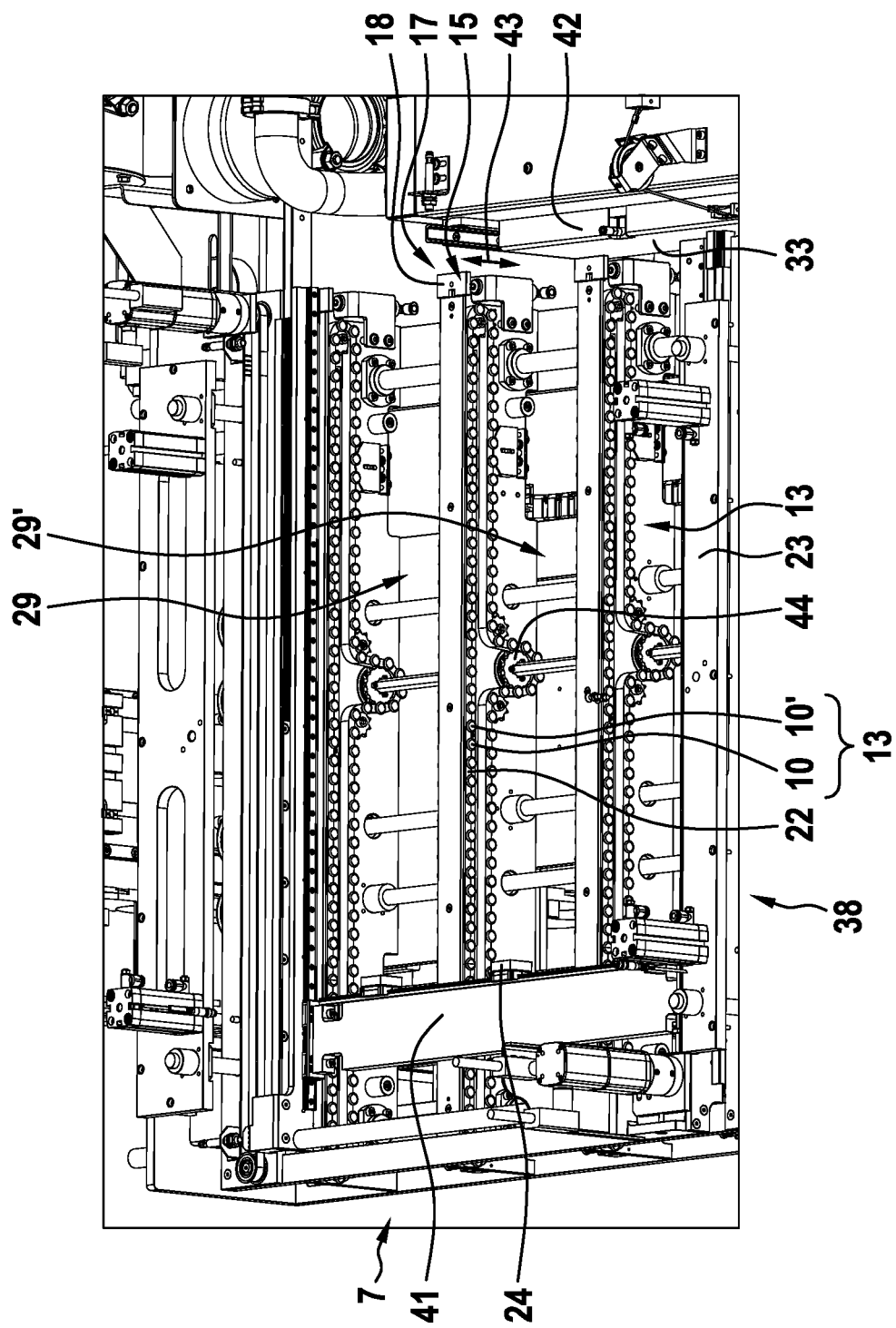
FIG. 12 schematically illustrates a perspective of the supporting device without assemblies according to FIG. 10.
Figure 13:
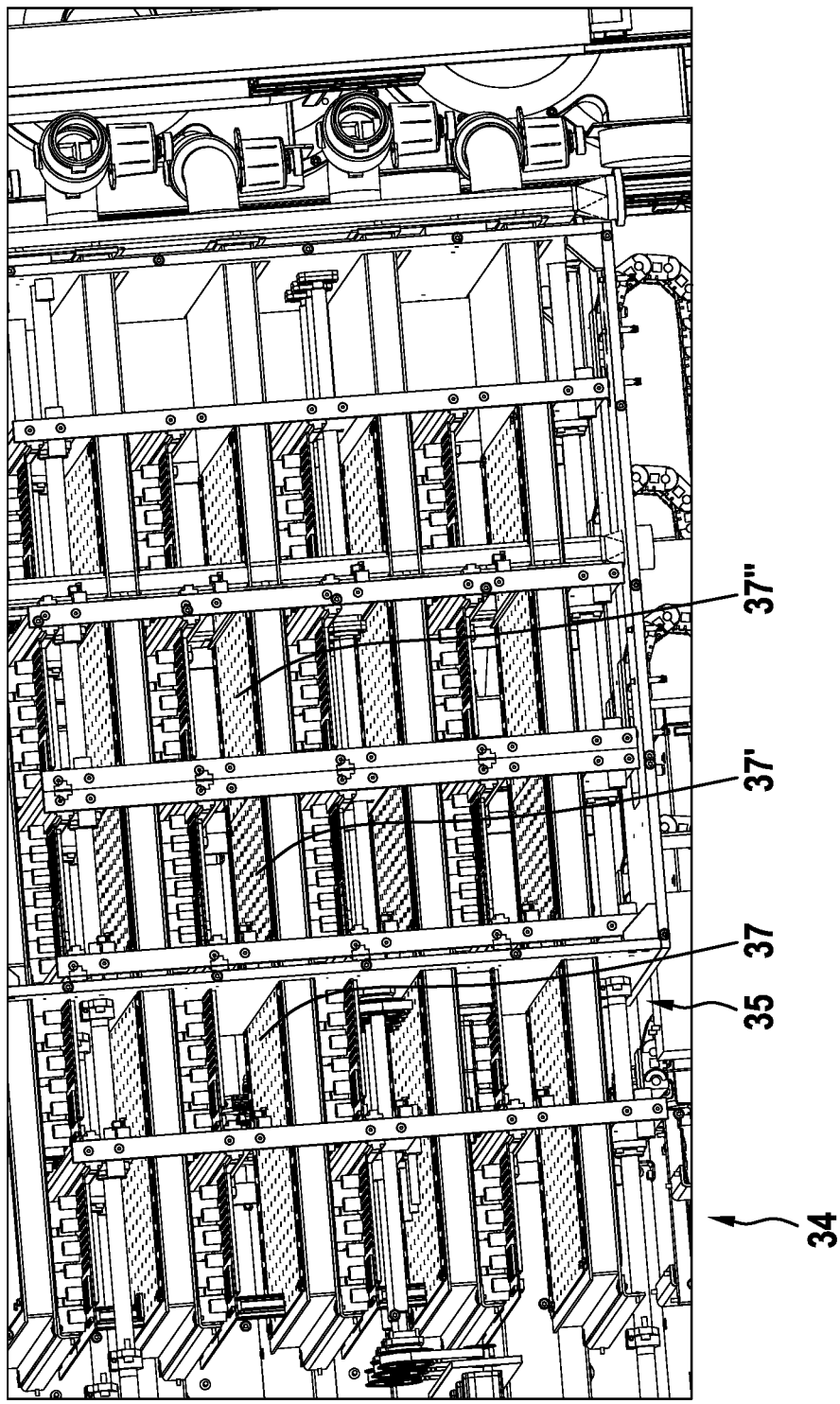
FIG. 13 schematically illustrates a perspective of a collecting device according to FIG. 10.

At least one restraining means 15 can be arranged or formed in and/or on and/or near or directly adjacent to the supporting device 11. In embodiments, the at least one restraining means 15 is arranged at an end region, in particular at the end facing the process chamber apparatus 6, of the supporting device 11. The at least one restraining means 15 can thereby be used as a temporary assembly stop or as a temporary board stop, wherein the at least one restraining means 15 is movable between a blocking position 16 (see FIGS. 1, 12) and a release position 17 (see FIG. 7). In the blocking position 16, a movement of at least one assembly 2 carried by the supporting device 11 in the direction of the displacement movement 9 is inhibited or blocked. In the release position 17, a movement of at least one assembly 2 carried by the supporting device 11 in the direction of the displacement movement 9 can be released.

Figure 8:
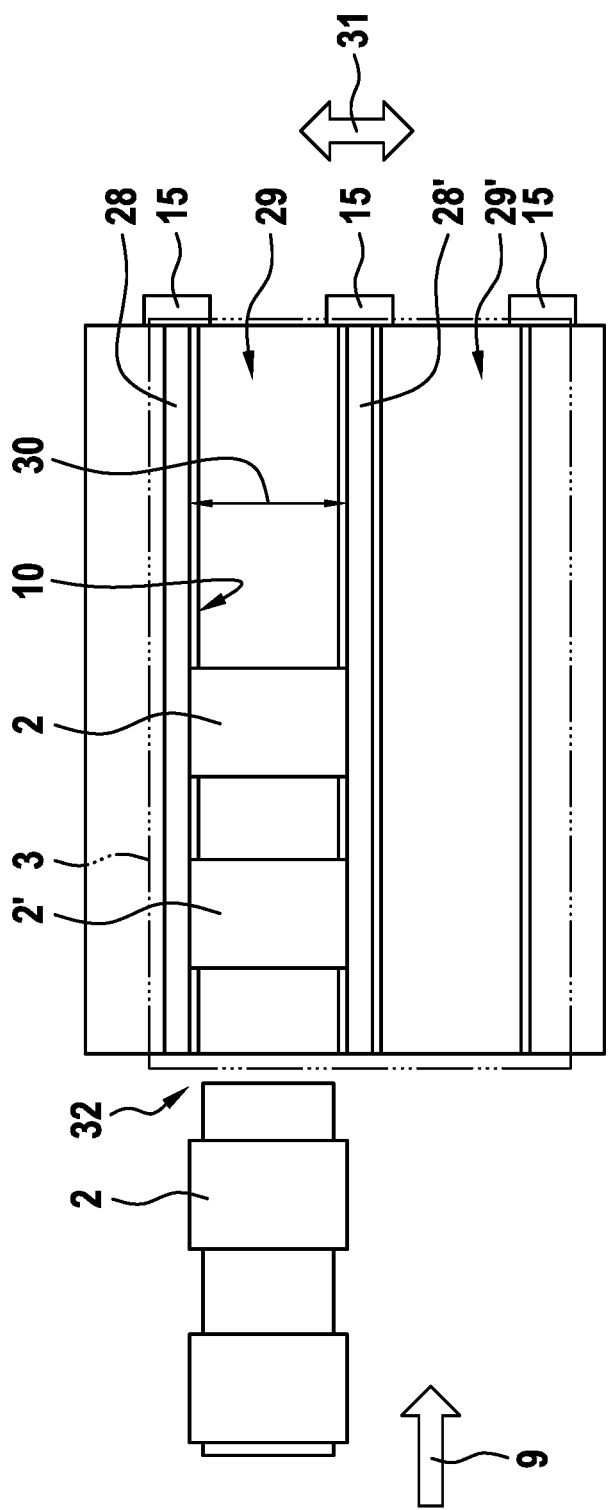
FIG. 8, 9 schematically illustrates the supporting device in different positions for receiving assemblies from an insertion device in the top view according to an embodiment example.

For example, the position of the restraining means 15 can be seen from FIG. 8; these are configured, for example, in such a way that they project into the width of the receiving tracks 29, 29' for receiving the assemblies 2, 2' and temporarily restrain them from further movement by contact with the assemblies 2, 2'. The restraining means 15 can comprise a contact body, in particular a plate-like contact body, which can be moved in its height, e.g. by means of an actuating cylinder, cf. FIG. 12. The surface of the contact body, in particular a plate-like contact body, can be used at least in sections as a supporting region 18 for at least temporary support of the assemblies 2, 2'.

Thus it is possible that the at least one restraining means 15 is configured in the blocking position 16 to prevent at least one assembly 2 moved on the supporting device 11 in the displacement direction 9 from being transported further, in particular from being transported into a working zone 4 of the process chamber apparatus 6. For this purpose, the restraining means 15 can be configured, for example, as a vertically movable contact body (cf. arrow 43) which, upon assuming a positioning at the level of the assemblies 2, 2', inhibits their further movement or acts as a stop for these assemblies 2, 2'. Thus, it is possible that despite continuous movement of the bearing means 10, 10' along the annular path 38 or the relative movement of the bearing means 10, 10' and the connecting member 22 relative to the base body 40 of the supporting device 11, the at least one assembly 2, 2' remains stationary relative to the position, in particular of the base body 40, of the supporting device 11 and a rolling movement or a rotational movement 25 of the bearing means 10, 10' relative to the base body 40 of the supporting device 11 is prevented. A rotational movement 25 of the bearing means 10, 10' results due to the relative movement in response to the retention of the at least one assembly 2, 2' by the restraining means 15.

The restraining means 15 may alternatively or additionally comprise a supporting region 18, which is suitable for at least temporarily supporting at least one assembly 2 moved during at least one section of the displacement movement 9. A support here means that at least part of the weight force of the at least one assembly 2 is supported at least partially on the supporting region 18. In other words, the supporting region 18 can be considered, for example, as an extension of the supporting means 13, in particular the bearing means 10, 10', of the supporting device 11. In embodiments, the restraining means 15 is arranged or formed in such a way that the restraining means 15 at least or exclusively in the release position 17 reduces or shortens, by means of its supporting region 18, a distance to be passed by the at least one assembly 2, 2' of (a) an interruption of a contact region of the assembly 2, 2' with the supporting device 11 and the process chamber 5 or (b) a gap 19 between the supporting device 11 and the process chamber 5.

In embodiments, the device 1 is configured to move the at least one assembly 2 in at least one section of the displacement movement 9 by means of a superimposed action of a force 8 acting on the at least one assembly 2 through the displacement device 7 and a movement of the supporting means 13 carrying the at least one assembly 2, in particular at least one bearing means 10, 10', of the supporting device 11. Here, for example, in the case of rotatably mounted bearing means 10, 10', it may result that the bearing means 10, 10' rotate about their respective axis of rotation 20 at a lower speed (rotational speed) than in the case of non-movement of the bearing means 10, 10' and the connecting member 22 with respect to their common relative movement relative to the supporting device 11, in particular to the base body 40 of the supporting device 11. In other words, the displacement device 7 can push the assemblies 2, 2' resting on the bearing means 10, 10', whereby the effective movement component starting from the displacement device 7 is reduced by the movement of the bearing means 10, 10' already taking place along the member-conditioned relative movement or ring movement, whereby the amount of the force 8 applied to the assembly by the displacement device 7 can be reduced and/or controlled. Thus, for example, it can be provided that during the bringing into contact of the displacement device 7 with an assembly 2, 2' and/or during the bringing into contact of two assemblies 2, 2' with each other, due to the action of the displacement device 7 on one of the two assemblies 2, 2', by an adaptation and/or execution of an annular movement or a relative movement of the supporting means 13, in particular of the bearing means 10, 10', the amount of force can act reduced in comparison with the amount of the force 8 during the displacement movement 9 after the bringing into contact.

The at least one bearing means 10, 10', can be rotatably mounted about an axis of rotation 20, in particular oriented perpendicular to the displacement movement 9. This axis of rotation 20 can, for example, be oriented parallel to the main extension plane of the supporting device 11 and/or to the main extension plane to the at least one assembly 2, 2' supported on the supporting device 11. In embodiments, at least one component of the displacement movement 9 of the at least one assembly 2, 2' arranged on a bearing means 10, 10' can lead to a rotational movement 21 or to a rolling movement about the rotational axis 20 of the at least one rotatably mounted bearing means 10 as a result of the action of the displacement device 7 on the at least one assembly 2, 2', cf. FIG. 7. The action of the displacement device 7 can in this case comprise pressurization of the assembly 2, 2' in the direction of the displacement movement 9.

It is further apparent that the rotational movement 21 during the action of the force 8 acting on the at least one assembly 2 by the displacement device 7, occurs in a different rotational direction than the rotational movement 25 of the bearing means 10, 10' which occurs during the restraint of the at least one assembly 2, 2' by the restraining means 15 located in the restraining position, cf. FIGS. 1 and 7.

At least two bearing means 10, 10' can be connected via a connecting member 22, for example via a connecting member 22 configured as a conveyor belt or as a chain, and can be moved at least in sections in the direction of the displacement movement 9, in particular driven by a motor. In embodiments, at least two bearing means 10, 10' perform an at least sectionally linear transport movement in the direction of the displacement movement 9, in which an assembly 2, 2' arranged on these bearing means 10, 10' performs at least one component of a, in particular linear, displacement movement 9. The connecting member 22 is movably mounted on the supporting device 11 via a bearing. The bearing arrangement enables a ring-like or annular movement, in particular following a closed ring, of the connecting member 22 and thus also of the bearing means 10, 10' attached to the connecting member 22. For example, a conveyor belt-like connecting member 22 is visible from FIG. 12, on which a plurality of respective rotatably mounted bearing means 10, 10' are arranged. The drive wheel 44 can be used to drive the connecting member 22 and the bearing means 10, 10'. The connecting member 22 is deflected at the end regions of the supporting device 11 via deflection means configured, for example, as sprockets.

The at least one displacement device 7 can, for example, comprise at least one displacement element 24 movably mounted on a holding body 23 on the displacement device side for at least temporary contact with at least one assembly 2, the displacement element 24 being movable at least in sections parallel and/or perpendicular to the displacement movement 9. Here, the displacement element 24 can be movably mounted or displaceable relative to the holding body 23. The holding body 23 is a component of the displacement device 7 and can be configured, for example, as a holding frame.

As can be seen by way of example in the embodiment of FIG. 5, the displacement device 7 comprises a base body which forms the interface of the displacement device 7 with the rest of the supporting device 11. For example, the base body is connected to the base body 40 of the supporting device 11, in particular in a planar manner. Furthermore, the displacement device 7 comprises column bodies 45 which support the holding body 23 in a movable or displaceable manner relative to the base body and/or relative to the base body 40. The holding body 23 comprises a pull-out body 46 which allows a displacement element 24 movably mounted thereon and/or a cross member 41 movably mounted thereon to move into a position laterally relative to the base body and/or base body 40.

By means of an in particular linear movement or by means of a, in particular linear, movement of the crosshead 41, the at least one displacement device 7 can carry out an in particular linear displacement movement 9 on the at least one assembly 2, 2'. In embodiments, the displacement device 7 comprises a plurality of displacement elements 24 which are connected to the crosshead 41 in a non-positive and/or positive manner, in particular in a non-destructively detachable manner. This makes it possible to replace the connecting elements 24 that are in direct contact with the assemblies 2 in a simple and convenient manner. For example, at least two, in particular three, displacement elements 24 are arranged on the crosshead 41—as can be seen in the embodiment shown in FIG. 12. Alternatively or additionally, at least one displacement element 24, such as exactly one displacement element 24, can be associated with each receiving track 29, 29' of the supporting device 11. It can also be provided, for example, that in different receiving tracks 29, 29', displacement elements 24 respectively associated therewith can be moved or are movable independently of one another. This can make it possible, for example, for assemblies 2, 2' arranged in different receiving tracks 29, 29' of the supporting device 11 to be moved independently of one another by a specific movement of the corresponding displacement elements 24.

The crosshead 41 can span or overlap at least one receiving track 29, 29', such as all receiving tracks 29, 29', of the supporting device 11. In particular, the crosshead 41 can be placed at the lateral end regions of the supporting device 11 and/or be movably mounted on a holding body 23 and/or on a pull-out body 46 of the supporting device 11.

As shown schematically in FIGS. 2 to 7, starting from the displacement device 7, a targeted movement of at least one assembly 2 in the provisioning zone 3 as well as in the working zone 4 can take place. The displacement element 24 of the displacement device 7 can, for example, be movably arranged or configured on the supporting device 11 in such a way that the displacement element 24 or at least one component of the displacement device 7 can pass over at least one assembly 2 arranged on the supporting device 11, such as at least two assemblies 2, 2' arranged on the supporting device 11. For this purpose, the displacement element 24 or at least one component of the displacement device 7 can be placed in a first position (cf. FIG. 2) at the level of the at least one assembly 2, 2' arranged on the supporting device 11 and, starting from this position, can be moved into a relatively higher or lower position, for example by a movement component oriented perpendicular to the main extension plane, relative to the at least one assembly 2 arranged on the supporting device 11. This can be achieved by moving the displacement element 24 vertically upwards or downwards relative to a stationary assembly 2, 2' (not shown) or by moving the means supporting the assembly 2, 2' (e.g. supporting device 11) vertically upwards or downwards at least partially relative to a displacement element 24 stationary at least at its height. Finally, for example, both the displacement element 24 and the means of the supporting device 11 carrying the assembly 2, 2' can each perform a movement that results in the displacement element 24 and the assembly 2, 2' moving out of a common plane.

In this position of the displacement element 24, which is moved out of the main extension plane of the at least one assembly 2, the displacement element 24 or at least a component of the displacement device 7 can pass over or under the assembly 2. After the displacement element 24 has bridged over/passed over (or passed under) the assembly 2 in a direction parallel to the intended displacement movement 9 of the assembly 2, cf. FIG. 4, the displacement element 24 is arranged at an end section of the provisioning zone 3 facing the process chamber 5. Starting from this position of the displacement element 24, the holding body 23 and/or a pull-out body 46 movably mounted on the holding body 23 can be pulled-out, at least in sections, into a pull-out position 27 projecting at least into the working zone 4, cf. FIG. 5. In embodiments, it can be provided that the holding body 23 and/or a pull-out body 46 movably mounted on the holding body 23 projects into the interior of the process chamber 5 at least predominantly, such as completely. In other words, the holding body 23 and/or a pull-out body 46 mounted thereon can, for example, be moved or pulled out, such as motor-driven, between a first covering position (cf. FIG. 4) in which it is at least predominantly, in particular completely, in coverage (top view) with the base body 40 and/or with the supporting device 11 and a second pull-out position 27 (cf. FIG. 5) positioned laterally offset with respect to the base body 40 and/or with respect to the supporting device 11. By temporarily projecting the holding body 23 and/or the pull-out body 46, which is mounted on the holding body 23 such that it can be pulled out, into the working zone 4 of the process chamber apparatus 6, the potential range of movement of the displacement element 24 or at least one component of the displacement device 7 into the working zone 4 is temporarily extended. In FIG. 7, a pushing out of the assemblies 2, 2' placed in the process chamber 5 is shown, wherein these assemblies 2, 2' are displaced to a collection zone 35 via a transfer opening 33' arranged or formed at the end of the process chamber 5 facing away from the supporting device 11. This results in the process chamber 5 being emptied.

In deviation from a complete traversal of a group of assemblies 2, the displacement element 24 can also selectively traverse individual assemblies 2 and thus move them individually into the working zone 4. Alternatively or additionally, the displacement element 24 may move individual assemblies 2 of a group of assemblies 2 arranged within the working zone 4 out of the working zone 4 of the process chamber apparatus 6 by moving the displacement element 24 accordingly. In this case, the displacement element 24 can selectively move next to an assembly 2 to be moved, in particular an isolated assembly 2, and move it in or out.

It is possible that the holding body 23 or a pull-out body 46 movably mounted on the holding body 23 is configured to be actively or passively extendable or configured such that it can be pushed out actively or passively. In other words, the holding body 23 or a pull-out body 46 can be configured in such a way that at least parts of these are configured to be movable, in particular horizontally, or can be moved. For example, the holding body 23 itself or a pull-out body 46 movably mounted on the holding body 23 may be arranged to perform a movement, in particular an exclusively linear movement. For example, the holding body 23 and/or the pull-out body 46 is configured to be telescopic at least, such as predominantly, such as completely, in sections.

The movement of the at least one assembly 2, 2' in a transition region between the process chamber 5 and the collection zone 35 and/or in the collection zone 35 or within the collection carrier 36 can, for example, be effected at least partially by the action of the displacement device 7, in particular by contact with the displacement element 24. It is possible that the movement of the at least one assembly 2 in the transition region between the process chamber 5 and the collection zone 35 and/or within the collection zone 35 or within the collection carrier 36 can be or is carried out at least in sections, in particular exclusively via a movement means (not shown) associated with the collecting device 34.

The fact that the holding body 23 and/or the pull-out body 46, which is mounted so as to be extendable on the holding body 23, only temporarily protrudes into the working zone 4 of the process chamber 5 or can also be moved out of it again makes it possible for the process chamber 5 or the transfer openings 33, 33' of the at least one process chamber 5, 5' to be closed by a closure means 42. In other words, a displacement device 7 arranged on the supporting device 11 can be moved out of the process chamber 5 and thus an obstacle for closing the transfer opening 33 can be removed.

After the process chamber 5 has been emptied, at least one component of the displacement device 7 or the at least one displacement element 24 can be positioned in front of and in the plane of the at least one assembly 2, 2' arranged on the supporting device 11, as viewed in the direction of movement 9. For this purpose, the component of the supporting device 11 carrying the assembly 2, 2' in the provisioning zone 3 can be moved upwards again from the lower position, so that the assembly 2, 2' is again level (in a common/overlapping plane area) with the displacement element 24, cf. position in FIG. 2. Starting from this position, at least one component of the displacement device 7 or the at least one displacement element 24 can serve as a pusher or as a means for applying a pushing force to this assembly 2, 2' and finally carry out a displacement or a pushing of the assembly 2, 2' into the process chamber 5, cf. FIG. 7.

The holding body 23, in particular configured as a holding frame, can for example be movably attached or fastened to a base body of the displacement device 7 and/or to a base body 40 of the supporting device 11. In embodiments, the holding body 23 is movable at least in sections perpendicularly and/or parallel (a) to a main extension plane of the holding body 23 and/or (b) to a main extension plane of the base body and/or of the base body 40 and/or (c) to a main extension plane of the supporting device 11. Perpendicular movability of the holding body 23 can be achieved, for example, by telescopic column bodies 45 supporting the holding body 23 relative to a base body and/or to a base body 40. Alternatively, the holding body 23 can be movably attached to rigid or non-telescopic column bodies 45 in such a way that a vertical displacement of the holding body 23 relative to the base body and/or to the base body 40 is achieved.

Figure 9:
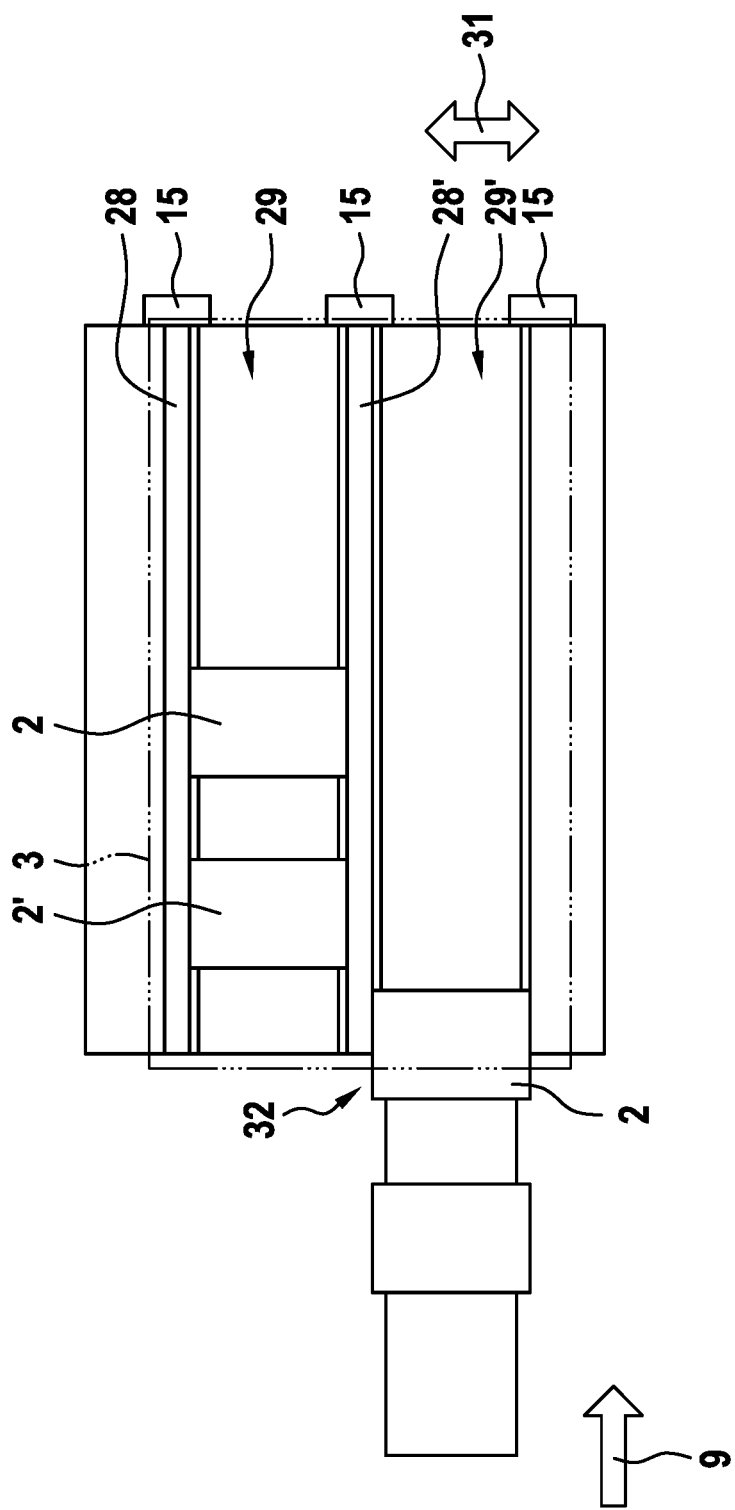

The supporting device 11 can, for example, comprise wall bodies 28 running parallel to the displacement movement 9 and/or oriented parallel to one another, cf. FIGS. 8 and 9. In this case, for example, a receiving track 29, 29' for receiving at least one assembly 2, 2', in particular a first group of assemblies 2, 2', can be formed between two wall bodies 28, 28'. In embodiments, a distance 30 of the wall bodies 28 corresponds at least approximately to the length dimension or width dimension of the at least one assembly 2, 2' present in the transverse direction to the displacement movement 9. It may be provided that the bearing and/or supporting means 10, 10', 13 for supporting the at least one assembly 2, 2' are arranged or formed on the wall bodies 28, 28'. The wall bodies 28, 28' can thus form a component of the supporting device 11.

The supporting device 11 can, for example, have at least one receiving track 29, 29' for supportingly receiving at least one assembly 2, 2', the receiving track width or the distance 30 between two wall bodies 28, 28' being variable, in particular variable by a motor. The distance 30 between the wall bodies 28, 28' can be changed, for example, in the manner of a parallel displacement relative to one another and thus adapted to a possibly changing width of the assemblies 2, 2'. A receiving track 29 means here that a receiving channel, in particular a straight channel, is formed in which at least one assembly 2, 2', such as at least two assemblies 2, 2', can be received.

For example, the supporting device 11 can be or is movable at right angles to the displacement movement 9 of the at least one assembly 2, 2' for carrying out an orientation movement 31, and in particular parallel to a main extension plane of the supporting device 11. FIGS. 8 and 9 show two positions that can be assumed by executing an orientation movement 31. In this case, by means of the orientation movement 31, a first receiving track 29 of the supporting device 11 for receiving at least one assembly 2, 2' and at least one second receiving track 29' of the supporting device 11 for receiving at least one further assembly 2, 2' can optionally be moved to a corresponding orientation and/or position to a, in particular single-track, introduction zone 32 for introducing at least one assembly 2 to the supporting device 11 or into the provisioning zone 3. In the position shown in FIG. 8, the first receiving track 29 is positioned corresponding to the introduction zone 32 for receiving an assembly 2 from this introduction zone 32. In FIG. 9, the supporting device 11 is moved according to the orientation movement 31 in such a way that the further receiving track 29' of the supporting device 11 is positioned corresponding to the introduction zone 32, so that an assembly 2 moving from the introduction zone 32 in the direction of the supporting device 11 is received in the further receiving track 29'.

The introduction zone 32 may comprise an insertion device which is configured to move assemblies 2 from a location remote from the device 1 to the supporting device 11 or to bring them into or onto the supporting device 11 in such a way that a transfer of the assemblies 2, 2' from the introduction zone 32 to the supporting device 11, in particular into or onto a provisioning zone 3 of the supporting device 11, can take place.

A process chamber apparatus 6 can, for example, be equipped with at least two process chambers 5, 5' arranged one above the other, wherein the supporting device 11, or at least components thereof, is or are vertically displaceable in such a way in such a way that at least one assembly 2 carried by the supporting device 11 can be optionally displaced or transferred into a first or a further process chamber 5, 5' of the process chamber apparatus 6, cf. FIG. 1. For this purpose, the supporting device 11 or a component of the supporting device 11 comprising the bearing means 10, 10' or the carrying means 13 can be vertically displaceable. In the embodiment of the device 1 shown in FIG. 10, the device 1 comprises four process chambers 5, 5' arranged one above the other, in particular congruently in plan view. The supporting device 11 can be moved vertically so that a transfer of an assembly between the supporting device 11 and the process chamber 5, 5' can be carried out by moving to a predefined vertical position.

A process chamber apparatus 6 can, for example, be equipped with at least one process chamber 5, 5', wherein at least one process chamber 5, 5' comprises a first and a further transfer opening 33, 33'. The transfer openings 33, 33' serve for passing through or moving at least one assembly 2, 2' between (a) a working zone 4 on the process chamber side and (b1) a provisioning zone 3 on the supporting device side and/or (b2) a collection zone 35 on the collecting device side. The transfer openings 33, 33' can be arranged or formed on two opposite side surfaces of the at least one, in particular cuboid, process chamber 5. In embodiments, a first group of transfer openings 33 of respective process chambers 5, 5' are arranged or formed on a first side surface of the process chambers 5, 5' and a further group of further transfer openings 33' of respective process chambers 5, 5' are arranged or formed on a further side surface of the process chambers 5, 5', in particular opposite to the first side surface. In other words, the transfer openings 33, 33' to the provisioning zone 3 or to the collection zone 35 of several, in particular all, process chambers 5, 5' of a device 1 are arranged or formed on the same sides of the process chamber apparatus.

The transfer openings 33, 33' of the process chambers 5, 5' can each be closed or temporarily closed by means of closure means 42. This is advantageous in order to enable targeted temperature control of an assembly 2 in an interior space or in the working zone 4 of a process chamber 5, 5'. Also, the energy expenditure for the temperature control of the interior space or the working zone 4 can be reduced and/or a higher accuracy can be achieved in the temperature control of the interior space or the working zone 4 of the process chamber 5, 5' and/or the assembly 2, 2' placed in the interior space.

Figure 10:
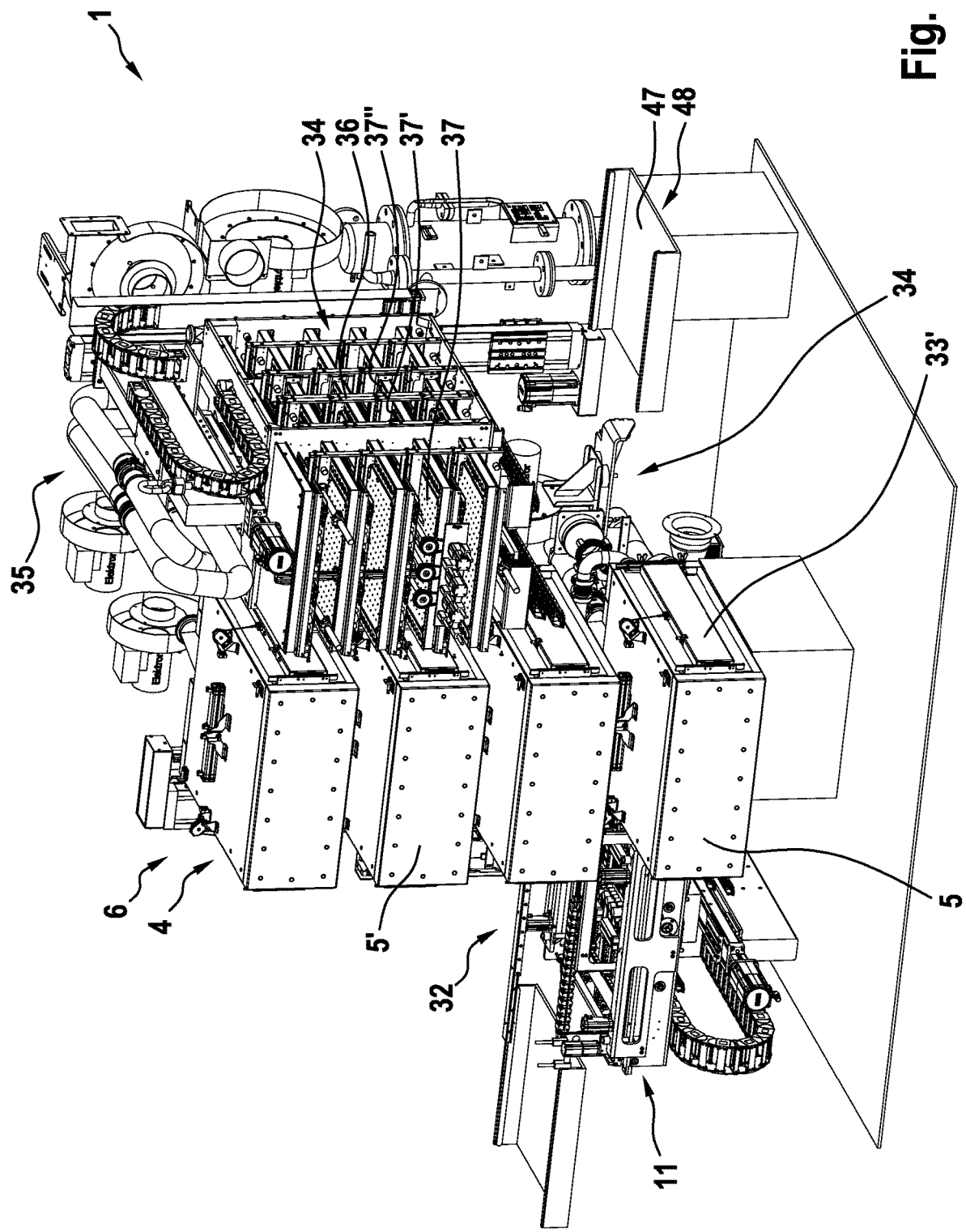
FIG. 10 schematically illustrates a perspective of a device according to an embodiment.
Figure 11:
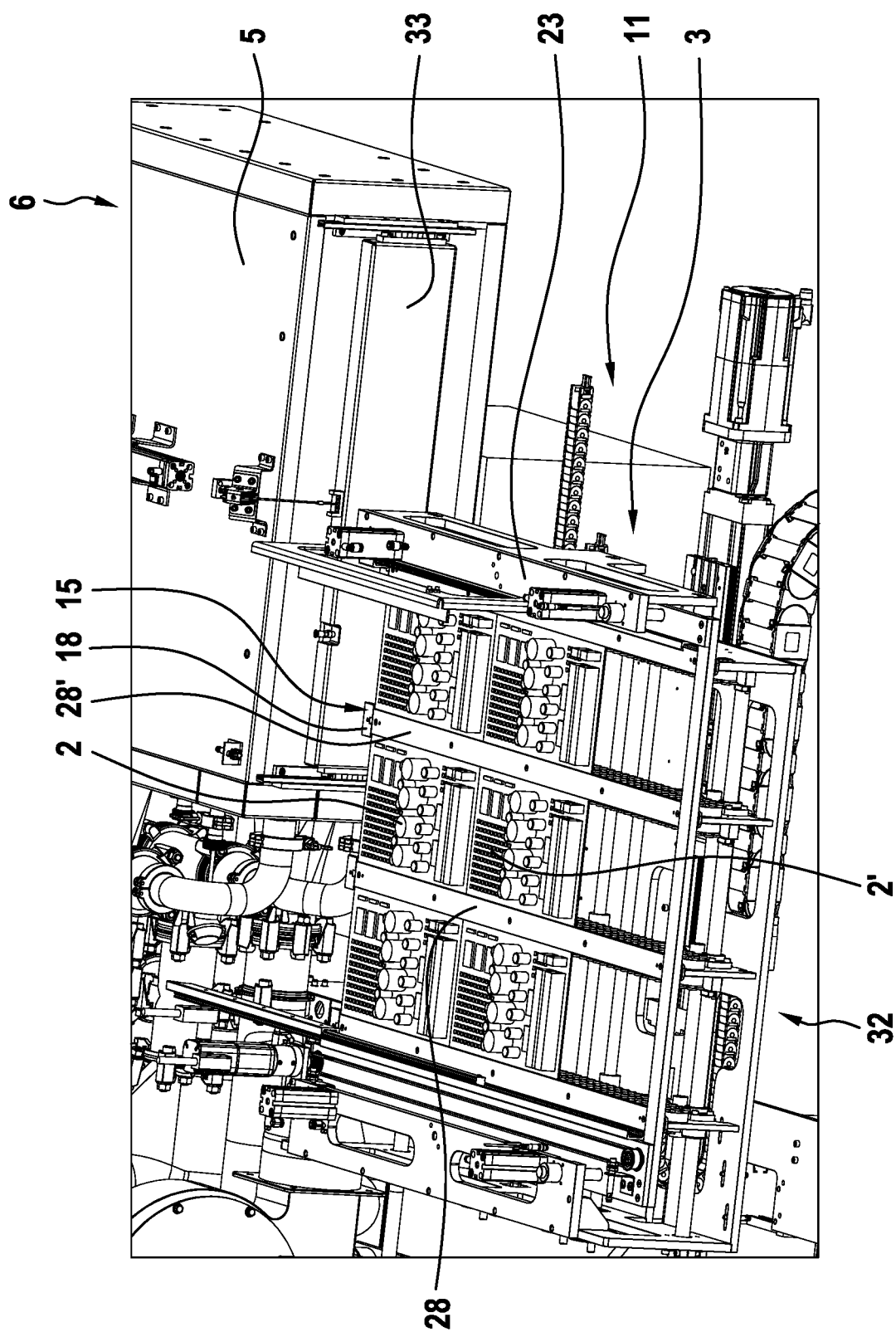
FIG. 11 schematically illustrates a perspective of an assembly-supporting supporting device according to FIG. 10.

As can be seen in particular from FIG. 10, the device 1 can comprise a collecting device 34, wherein the collecting device 34 comprises a collection carrier 36, which is movable, in particular horizontally and/or vertically, relative to the process chamber apparatus 6, in order to receive at least one assembly 2 moved out of the at least one process chamber 5, 5', such as directly. In embodiments, the collecting device 34, in particular the collection carrier 36, comprises a plurality of groups of receiving tracks 37, 37', 37", such as arranged or formed one above the other and/or side by side. Thus, receiving tracks 37, 37', 37" may be arranged or formed side by side and/or one above the other. This makes it possible to store or collect or temporarily receive a plurality of assemblies 2, 2' using a small volume and/or taking up a small amount of space of the device 1 in a factory hall. The collection carrier 36 is movable in such a way that a defined receiving track 37, 37', 37" can be selectively moved to or through a transfer opening 33' of a process chamber 5, 5' in such a way that an assembly 2, 2' is moved between the collection carrier-side receiving track 37, 37', 37" and the working zone 4 of the process chamber 5, 5'. The collecting device 34 can be used as a storage of at least one assembly 2, 2' and/or as a means changing an order of the moved assemblies 2, 2' and/or as a cooling area for active and/or passive cooling of the at least one assembly 2, 2'. The collecting device can transfer the assemblies 2, 2' received therein to a removal zone 48 of a removal device 47 adjacent to the device 1. For this purpose, the collecting device 34 and/or the removal device 47 can optionally have means which allow the assemblies 2, 2' to be displaced.

It is possible that the collecting device 34 is configured in such a way that it surrounds at least in sections, such as predominantly, such as completely, the assemblies 2, 2' received therein with a defined gas atmosphere, in particular an inert gas atmosphere. It is thus possible for the collecting device 34 to have a receiving volume which can be closed off at least temporarily in a gas-tight manner and in which a defined gas atmosphere, in particular an inert gas atmosphere, prevails and/or can be built up, so that the assemblies 2, 2' received in this receiving volume are exposed to a corresponding gas atmosphere.

The process of supplying the assemblies 2, 2' into the process chamber and the dwell time of the assemblies 2, 2' in this process chamber as well as the control of an active cooling device in or on the collecting device for active cooling of the assemblies 2, 2' located in the collecting device and/or the control of the collecting device for the defined dwell time of the assemblies in the collecting device for active or passive cooling of the assemblies 2, 2' while these are accommodated in the collecting device 34 can be predefined. The collecting device 34 can comprise a cooling device (not shown) and/or a cooling device can be assigned to the collecting device 34, so that an at least temporary active cooling of the assembly(s) 2, 2' placed in the collecting device 34 can be carried out by means of the cooling device.

Thus, for example, it is possible that the cooling time of the assemblies 2, 2' can be specifically influenced by the collecting device 34 and the sequence or a subsequent pick-up of assemblies 2, 2' in this collecting device 34. Provided that the number of receiving locations for assemblies 2, 2' in the working zone 4 of the process chamber 6 is identical to that of the collecting device 34, the heating duration can correspond to the cooling duration. For example, it is also possible to operate in a mode in which the collecting device has a surplus of holding locations for assemblies 2, 2' compared to the process chamber 6, so that this surplus, quasi as a disposition volume or buffer volume, can be used to selectively extend the dwell time for the assemblies 2, 2' within the collecting device 34 compared to the dwell time within the working zone.

In the synopsis of FIGS. 2 and 3, it can be seen that a first assembly 2, which is closer to the front in the direction of the displacement movement 9 or to the process chamber apparatus 6 than a further, adjacent assembly 2', remains in a waiting position due to the restraining means 15 located in the blocking position 16, while the further, adjacent assembly 2' is transported further by means of a conveying action due to the movement of the supporting means 13, in particular the bearing means 10, 10', of the supporting device 11. In this case, any bearing means 10, 10' which support the first assembly 2 (here: directed counterclockwise) perform a rotational movement 25 about the axes of rotation 20. Thus, during the other movement of the displacement device 7, in particular of the displacement element 24, a compact arrangement of the assemblies 2, 2' on or on the supporting device 11 can be achieved even without the influence of the latter. In FIG. 3, the relative movement of the at least two assemblies 2, 2' is terminated so that they are arranged by, in particular, direct contact with each other. The rotational movement 25 when the restraining means 15 is effective (i.e. restraining means 15 in blocking position) can take place in the opposite direction to the rotational movement 21 during a permitted sliding movement by the displacement element 24 (i.e. restraining means 15 in release position).

Alternatively or additionally, it may be provided that at least as assemblies 2, 2' do not directly contact each other, but between two assemblies 2, 2' a displacement element 24 or a further movably supported element (not shown) may be moved or placed. In other words, the displacement element 24 can be positioned between two assemblies 2, 2', the displacement element 24 being moved into the plane of the assembly 2, 2' where it serves as a stop for at least one assembly 2, 2'. In this way, the further assembly 2' can be set in motion by means of the ring movement or the conveyor belt-like movement of the bearing means 10, 10' and serve as a stop or restraining means for this further assembly 2' by means of the correspondingly arranged displacement element 24. Thus, in addition to its displacement function by a pushing movement onto an assembly 2, 2', the displacement element 24 additionally obtains a stopper function or stop function for forming an arrangement of assemblies 2, 2' on gap, in particular within the provisioning zone 3 and/or the working zone 4 of the process chamber 5 and/or the collecting device 34. In a next step, the ring movement or the conveyor belt-like movement of the bearing means 10, 10' can be stopped, so that no further conveying of the further assembly 2' resulting from this movement takes place. Consequently, the displacement element 24 can thus be moved out of the intermediate space between the two assemblies 2, 2', the intermediate space remaining. This has the advantage that mechanical interference or thermal interference due to any contact between the two assemblies 2, 2' is prevented. Also, the existing intermediate space can be used for inserting or introducing the displacement element 24 in order to thus carry out a defined movement or a defined displacement of an individual assembly 2, 2', in particular the further assembly 2'.

An arrangement provided with a gap or an arrangement on gap of the assemblies 2, 2' can serve for their placement (a) in or at the provisioning zone 3, in particular in or at a supporting device 11, and/or (b) in the working zone 4 of a process chamber 5 and/or (c) in or at a collecting device 34, in particular in a collection carrier 36 and/or a receiving track 37, 37', 37" of a collecting device 34. Thus, the displacement element 24 can be moved in a targeted manner into the previously formed gaps or spaces between the assemblies 2, 2' in order to subsequently move or displace at least one assembly 2, 2' in a defined manner by pushing, starting from the positioning of the displacement element 24 in this gap.

It may be provided that the device 1 comprises at least two or more displacement elements 24 which are independently movably supported so that these multiple displacement elements 24 can each be used in a gap or for forming multiple gaps between multiple assemblies 2, 2'. Thus, each displacement element 24 can be used as an interspace-forming element for forming one interspace between a plurality of assemblies 2, 2', respectively.

It is possible that the displacement device 7 is configured to displace (a) an assembly 2, 2' arranged in a supporting device-side provisioning zone 3 into a process chamber-side working zone 4 and/or (b) an assembly 2, 2' arranged in a working zone 4 on the process chamber side into a provisioning zone 3 on the supporting device side and/or (c) to move an assembly 2, 2' arranged in a working zone 4 on the process chamber side into a collection zone 35 on the collecting device side and/or (d) to move an assembly 2, 2' arranged in a collection zone 35 on the collecting device side into a working zone 4 on the process chamber side. In particular, at least one, in particular all, of the aforementioned movements of the at least one assembly 2, 2' is carried out by contacting and applying a pushing force 8 to the at least one assembly 2, 2' by means of the displacement device-side displacement element 24.

The displacement device 7 can, for example, be configured in such a way that a movement of an assembly 2, 2' (a) at and/or via a gap (19) between the provisioning zone 3 on the supporting device side and the working zone 4 on the process chamber side and/or (b) at and/or via a gap (19) between the working zone 4 on the process chamber side and the collection zone 35 on the collecting device side and/or (c) within the working zone 4 and/or (d) within the provisioning zone 3, is effected exclusively by the action, such as directly contacting action, of the displacement device 7 or of the displacement element 24.

In a further advantageous embodiment, it may be provided that (a) the displacement device 7 is at least partially aligned with the supporting device 11 and/or (b) the displacement element 24 is aligned with the holding body 23 and/or (c) the holding body 23 is aligned with the base body of the displacement device 7 and/or with the supporting device 11, in particular to the base body 40 of the supporting device, and/or (d) the at least one bearing means 10, 10' within the supporting device 11 and/or (e) the bearing means 10, 10' is movable or movable by means of a motor about an axis of rotation 20 on the bearing means side and/or (f) a collecting device 34 is movable or movable by means of a motor. Here, for example, a motor can be used for a simultaneous or selective execution of at least two, in particular all, of said relative movements. Alternatively, at least for a part, in particular for all, of the said relative movements of components of the device 1, in particular of components of the displacement device 7, a separate motor can be used in each case, which can be controlled independently of further motors.

In addition to the device 1, the present disclosure comprises a method for displacing at least one assembly 2, 2' between a provisioning zone 3 and a working zone 4, in particular an interior, of at least one process chamber 5 of a process chamber apparatus 6 for soldering, in particular for reflow soldering, of the at least one assembly 2, 2', wherein the assembly 2, 2' carries out a displacement movement 9 at least in sections by means of a force 8, in particular a pushing force, which is transmitted or generated by a displacement device 7, in particular directly, and acts on the assembly 2, and is displaced.

The invention claimed is:

1. A system comprising:
a process chamber apparatus for soldering comprising a provisioning zone and a working zone of at least one process chamber; and
a device for displacing at least one assembly between the provisioning zone and the working zone, the device comprising:
at least one displacement device, wherein the at least one assembly carries out, at least in sections, a displacement movement, or such a displacement movement can be carried out, such that the at least one assembly is displaced by means of a force which is transmitted or generated by the displacement device and acts on the assembly;
a supporting device comprising at least one bearing means, wherein the at least one assembly is configured to be arranged on the at least one bearing means at least in sections during the displacement movement and is mounted on the supporting device by means of the at least one bearing means so as to be movable at least in the direction of the displacement movement,
wherein, on an end region of the supporting device, at least one restraining means is configured to be arranged, which is movable between a blocking position and a release position, wherein in the blocking position a movement of at least one assembly carried by the supporting device is inhibited in the direction of the displacement movement and, in the release position, a movement of at least one assembly carried by the supporting device is released in the direction of the displacement movement.

2. The system according to claim 1, wherein the device is configured, in a first section of the displacement movement, to carry out a displacement of the at least one assembly at least by a movement of the supporting device supporting the at least one assembly at least in sections and, in a further section of the displacement movement, a displacement of the at least one assembly is carried out at least by the action of the force acting on the at least one assembly by means of the displacement device.

3. The system according to claim 1, wherein, the at least one restraining means comprises a supporting region for at least temporarily supporting at least one assembly moved during at least one section of the displacement movement.

4. The system according to claim 1, wherein the device is configured to displace the at least one assembly in at least one section of the displacement movement by means of a superimposed action of a force acting by the displacement device on the at least one assembly by the displacement device and a movement of the supporting device.

5. The system according to claim 1, further comprising at least one bearing means rotatably mounted about an axis of rotation oriented perpendicularly to the displacement movement, wherein at least a component of the displacement movement of the at least one assembly arranged on a bearing means is configured to be carried out under rotary movement of the at least one rotatably mounted bearing means about the axis of rotation due to the action of the displacement device on the at least one assembly.

6. The system according to claim 1, further comprising at least two bearing means connected via a connecting member and are movable at least in sections in the direction of the displacement movement.

7. The system according to claim 1, wherein the at least one displacement device comprises at least one displacement element movably mounted on a holding body on the side of the displacement device for at least temporary contact with at least one assembly, wherein the displacement element is movable at least in sections parallel and/or perpendicular to the displacement movement.

8. The system according to claim 7, wherein:
the holding body is configured to be movably fastened or is fastened to a base body of the displacement device and/or to the supporting device; and
the holding body and/or a pull-out body are configured to be moved or pulled out between a first covering position, in which the holding body at least predominantly in coverage with the base body and/or a base body of the supporting device, and a second pull-out position, which is positioned laterally offset with respect to the base body and/or the base body of the supporting device.

9. The system according to claim 1, wherein that the supporting device comprises wall bodies running parallel to the displacement movement and oriented parallel to one another, wherein a receiving track for receiving at least one assembly is formed between two wall bodies.

10. The system according to claim 1, wherein the supporting device comprises at least one receiving track for supportingly receiving at least one assembly, wherein at least a receiving track width of at least one receiving track is variable.

11. The system according to claim 1, wherein the supporting device is movable at right angles to the displacement movement of the at least one assembly in order to carry out an orientation movement, the supporting device including a first receiving track for receiving at least one assembly and at least one second receiving track for receiving at least one further assembly configured to be displaced to an introduction zone for introducing at least one assembly to the supporting device in a corresponding orientation and/or position.

12. The system according to claim 1, further comprising a process chamber apparatus with at least two process chambers arranged one above the other, wherein the supporting device is vertically displaceable in such a way that at least one assembly supported by the supporting device can be displaced selectively into a first or a further process chamber of the process chamber apparatus.

13. The system according to claim 1, further comprising a process chamber apparatus having at least one process chamber, wherein at least one process chamber comprises a first and a further transfer opening for passing at least one assembly between a working zone on the process chamber side and a provisioning zone on a supporting device side and/or a collection zone on a collecting device side.

14. The system according to claim 1, further comprising a process chamber apparatus with at least one process chamber as well as a collecting device, wherein the collecting device comprises a collection carrier which can be displaced horizontally and/or vertically, in order to receive at least one assembly moved out of the process chamber.

15. The system according to claim 1, wherein the displacement device is configured to move:
an assembly arranged in a provisioning zone on a supporting device side into a working zone on a process chamber side, and/or
an assembly arranged in a working zone on the process chamber side into a provisioning zone on the supporting device side, and/or
an assembly arranged in a working zone on the process chamber side into a collection zone on a collecting device side, and/or
an assembly arranged in a collection zone on the collecting device side into a working zone on the process chamber side,
wherein the movement of the assembly is effected by contact and application of a force to at least one assembly by a displacement device-side displacement element of the displacement device.

16. The system according to claim 1, wherein the displacement device is configured in such a way that a movement of an assembly:
at and/or across a gap between the provisioning zone on a supporting device side and the working zone on a process chamber side, and/or
at and/or across a gap between the process chamber side working zone and a collecting device side collection zone, and/or
within the working zone, and/or
within the provisioning zone
is effected at least in sections by an action of the displacement device.

17. The system according to claim 1, wherein:
the displacement device is configured to be displaced or moved at least partially to a supporting device, and/or
the displacement device is configured to be displaced or moved to a holding body, and/or
the holding body is configured to be displaced or moved to a base body of the displacement device and/or to the supporting device, and/or
the at least one bearing means is configured to be displaced or moved within the supporting device, and/or
the bearing means is configured to be displaced or moved about an axis of rotation on the bearing means side, and/or
a collecting device
by means of a motor.

18. The system according to claim 1, further comprising a collecting device which is configured to receive at least one assembly moved out of a process chamber and a temperature control device for controlling a temperature of at least one assembly accommodated in the collecting device.

19. The system according to claim 1, further comprising a pull-out body mounted or configured so as to be movable at least in sections relative to a supporting device.

* * * * *